US012068202B2

(12) United States Patent
Paak et al.

(10) Patent No.: US 12,068,202 B2
(45) Date of Patent: Aug. 20, 2024

(54) INTEGRATED CIRCUIT DEVICE AND PREPARATION METHOD THEREOF

(71) Applicant: Huawei Technologies Co., Ltd., Shenzhen (CN)

(72) Inventors: Sunhom Steve Paak, Shenzhen (CN); Xiaolong Ma, Shanghai (CN); Yanxiang Liu, Shenzhen (CN); Daxiang Wang, Shenzhen (CN); Zanfeng Chen, Shenzhen (CN); Yu Xia, Shenzhen (CN); Huabin Chen, Shanghai (CN); Yongjie Zhou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 512 days.

(21) Appl. No.: 17/244,410

(22) Filed: Apr. 29, 2021

(65) Prior Publication Data

US 2021/0249311 A1    Aug. 12, 2021

Related U.S. Application Data

(63) Continuation of application No. PCT/CN2018/113167, filed on Oct. 31, 2018.

(51) Int. Cl.
*H01L 21/8234* (2006.01)
*H01L 21/02* (2006.01)
(Continued)

(52) U.S. Cl.
CPC .. *H01L 21/823481* (2013.01); *H01L 21/0259* (2013.01); *H01L 21/823412* (2013.01);
(Continued)

(58) Field of Classification Search
CPC ........... H01L 21/7846; H01L 29/42392; H01L 21/823481
See application file for complete search history.

(56) References Cited

U.S. PATENT DOCUMENTS 8,324,668 B2    12/2012  Huang et al.
9,515,172 B2    12/2016  Shin et al.
(Continued)

FOREIGN PATENT DOCUMENTS

CN    103199010 A    7/2013
CN    103715236 A    4/2014
(Continued)

OTHER PUBLICATIONS

Neogi et al., "Design space analysis of novel interconnect constructs for 22nm FDX technology," Proceedings of SPIE, SPIE Advanced Lithography, total 8 pages (2017).

*Primary Examiner* — Alia Sabur
(74) *Attorney, Agent, or Firm* — Leydig, Voit & Mayer, Ltd.

(57) ABSTRACT

This application provides an integrated circuit device and a preparation method thereof, and relates to the field of semiconductor technologies. An isolation section for suppressing a leakage current path of two adjacent transistors may be formed by using a simple process. The integrated circuit device includes a substrate and a fin protruding from the substrate. The integrated circuit device further includes two adjacent transistors. The two adjacent transistors use two spaced segments on the fin as respective channels of the two adjacent transistors. A part that is of the fin and that is located between the two spaced segments is processed to obtain an isolation section. The isolation section is used to suppress current transfer between the two channels of the two adjacent transistors.

10 Claims, 32 Drawing Sheets

(51) Int. Cl.
    *H01L 27/088*     (2006.01)
    *H01L 29/06*      (2006.01)
    *H01L 29/423*     (2006.01)
    *H01L 29/66*      (2006.01)
    *H01L 29/78*      (2006.01)
    *H01L 29/786*     (2006.01)

(52) U.S. Cl.
    CPC .. *H01L 21/823431* (2013.01); *H01L 27/0886* (2013.01); *H01L 29/0642* (2013.01); *H01L 29/0665* (2013.01); *H01L 29/42392* (2013.01); *H01L 29/66545* (2013.01); *H01L 29/66742* (2013.01); *H01L 29/66795* (2013.01); *H01L 29/7851* (2013.01); *H01L 29/78696* (2013.01)

(56) References Cited

U.S. PATENT DOCUMENTS

| | | |
|---|---|---|
| 9,793,273 B2 | 10/2017 | Liaw |
| 9,847,418 B1 | 12/2017 | Lim et al. |
| 2017/0033020 A1 | 2/2017 | MacHkaoutsan et al. |
| 2017/0053980 A1* | 2/2017 | Liou ............... H01L 21/823481 |
| 2017/0110456 A1 | 4/2017 | Jeon et al. |
| 2018/0033699 A1 | 2/2018 | Zhu |
| 2019/0229183 A1* | 7/2019 | Wang ................. H01L 29/0649 |
| 2020/0006559 A1* | 1/2020 | Mehandru ........... H01L 29/6653 |

FOREIGN PATENT DOCUMENTS

| | | | |
|---|---|---|---|
| CN | 107256844 A | 10/2017 | |
| CN | 108695230 A | 10/2018 | |
| EP | 3590886 A1 | 1/2020 | |

\* cited by examiner 50  70  50

| Step | Description |
|---|---|
| S30 | Form, on a substrate, a fin protruding from the substrate, where the fin includes a plurality of first semiconductor layers and a plurality of second semiconductor layers, the first semiconductor layers and the second semiconductor layers are alternately disposed in a thickness direction of the substrate, and a thickness direction of the fin is perpendicular to a gate length direction and the thickness direction of the substrate |
| S31 | Form at least two first dummy gates and at least one second dummy gate, where the at least two first dummy gates and the at least one second dummy gate are arranged in a gate length direction, each second dummy gate is located between two adjacent first dummy gates, and the first dummy gates and the second dummy gate all are in contact with two opposite side surfaces and a top surface of the fin |
| S32 | Form side walls on two sides of each of the second dummy gate and the first dummy gates in the gate length direction |
| S33 | Remove the fin that is not covered by the first dummy gates, the side walls on the two sides of the first dummy gates, the second dummy gate, and the side walls on the two sides of the second dummy gate; process a region that is of the second semiconductor layer of the reserved fin and that is not covered by the side walls to form inner walls; and use a remaining region that is of the second semiconductor layer and that is not covered by the side walls as a sacrificial layer |
| S34 | Respectively form a source and a drain on the two sides of each first dummy gate in the gate length direction |
| S35 | Form an inter-layer insulation layer, where an upper surface of the inter-layer insulation layer is aligned with upper surfaces of the second dummy gate and the first dummy gates |
| S36 | Remove the first dummy gates, the second dummy gate, and the sacrificial layer |
| S37 | Process the part that is of the fin and that is exposed after the second dummy gate is removed, to form an isolation section and further suppress current transfer in the part that is of the fin and that is exposed after the second dummy gate is removed |
| S38 | Form a gate dielectric layer and a gate at a location at which each of the second dummy gate and the first dummy gates is removed; form, at a location of the sacrificial layer, a gate material layer and a gate dielectric material layer that is wrapped outside the gate material layer; and use the gate material layer and the gate dielectric material layer as an auxiliary layer |

FIG. 12

INTEGRATED CIRCUIT DEVICE AND PREPARATION METHOD THEREOF

CROSS-REFERENCE TO RELATED APPLICATIONS

This application is a continuation of International Application No. PCT/CN2018/113167, filed on Oct. 31, 2018, the disclosure of which is hereby incorporated by reference in its entirety.

TECHNICAL FIELD

This application relates to the field of semiconductor technologies, and in particular, to an integrated circuit device and a preparation method thereof.

BACKGROUND

When an integrated circuit is designed and prepared, an isolation section needs to be formed between adjacent transistors that are closely arranged, to reduce a leakage current of a transistor. As shown in FIG. 1, two transistors are used as an example. When the two transistors are designed and arranged closely, active regions 50 of the two transistors cannot be directly connected to each other. An isolation section 70 usually needs to be formed between the two transistors, so that the two transistors can separately work. In addition, the two transistors do not affect each other in electrical features and logical operations. Therefore, how to implement isolation between transistors is a very important technical point.

SUMMARY

This application provides an integrated circuit device and a preparation method thereof. In this way, an isolation section for suppressing a leakage current path of two adjacent transistors may be formed by using a simple process.

To achieve the foregoing objectives, the following technical solutions are used in this application.

According to a first aspect of this application, an integrated circuit device is provided, including: a substrate and a fin protruding from the substrate. The integrated circuit device further includes two adjacent transistors. The two adjacent transistors use two spaced segments on the fin as respective channels of the two adjacent transistors. A part that is of the fin and that is located between the two spaced segments is processed to obtain an isolation section. The isolation section is used to suppress current transfer between the two channels of the two adjacent transistors. The part that is of the fin and that is located between the two spaced segments is processed by using a simple process, to suppress the current transfer between the two channels of the two transistors. In this way, structures and stress of the transistors on two sides of the isolation section are lightly affected, an introduced variation of a device feature parameter is minimum, an area resource occupied by the isolation section is relatively small, and a special winding resource does not need to be designed.

Optionally, the fin includes a first semiconductor layer, and the isolation section is doped with inert atoms.

Optionally, the fin includes a first semiconductor layer, and a thickness of the first semiconductor layer in the isolation section is less than a thickness of the channel of each of the two adjacent transistors.

Optionally, the fin includes the first semiconductor layer and an auxiliary layer that are alternately disposed. The auxiliary layer includes a gate material layer and a gate dielectric material layer that is wrapped outside the gate material layer. The isolation section and the channels are formed at the first semiconductor layer.

Optionally, the inert atoms include at least one type of hydrogen atoms, oxygen atoms, nitrogen atoms, carbon atoms, or silicon atoms.

According to a second aspect, a preparation method of an integrated circuit device is provided, including: forming, on the substrate, a fin protruding from a substrate; forming at least two first dummy gates and at least one second dummy gate, where the at least two first dummy gates and the at least one second dummy gate are arranged in a gate length direction, each second dummy gate is located between two adjacent first dummy gates, and the first dummy gates and the second dummy gate all are in contact with two opposite side surfaces and a top surface of the fin; forming an inter-layer insulating layer, where an upper surface of the inter-layer insulating layer is aligned with upper surfaces of the second dummy gate and the first dummy gates; and removing at least the second dummy gate, and processing a part that is of the fin and that is exposed after the second dummy gate is removed, to form an isolation section and further suppress current transfer in the part that is of the fin and that is exposed after the second dummy gate is removed. After the inter-layer insulating layer is formed, the upper surfaces of the second dummy gate and the first dummy gates are exposed. Therefore, the second dummy gate may be removed by using a simple process. In this way, a semiconductor sheet that is exposed after the second dummy gate is removed may be processed to form the isolation section for suppressing a leakage current path of two adjacent transistors. When the isolation section is formed in this manner, the following advantages are obtained: For example, structures and stress of the transistors on two sides of the isolation section are lightly affected, an introduced variation of a device feature parameter is minimum, an area resource occupied by the isolation section is relatively small, and a special winding resource does not need to be designed.

Optionally, the fin includes a first semiconductor layer. The processing a part that is of the fin and that is exposed after the second dummy gate is removed, to form an isolation section and further suppress current transfer in the part that is of the fin and that is exposed after the second dummy gate is removed includes: doping, with inert atoms by using one process of plasma trimming, plasma doping, or ion doping, a part that is of the first semiconductor layer and that is exposed after the second dummy gate is removed, to insulate the exposed part of the first semiconductor layer.

Optionally, the inert atoms include at least one type of hydrogen atoms, oxygen atoms, nitrogen atoms, carbon atoms, or silicon atoms.

Optionally, the fin includes a first semiconductor layer. The processing a part that is of the fin and that is exposed after the second dummy gate is removed, to form an isolation section and further suppress current transfer in the part that is of the fin and that is exposed after the second dummy gate is removed includes: processing, by using an etching process, a part that is of the first semiconductor layer and that is exposed after the second dummy gate is removed, to change a shape of the exposed part of the first semiconductor layer.

Optionally, the processing, by using an etching process, a part that is of the first semiconductor layer and that is exposed after the second dummy gate is removed, to change a shape of the exposed part of the first semiconductor layer includes: processing, by using the etching process, at least the part that is of the first semiconductor layer and that is exposed after the second dummy gate is removed, so that a thickness of the exposed part of the first semiconductor layer is reduced in a direction perpendicular to the gate length direction or a thickness direction of the substrate.

Optionally, the processing, by using an etching process, a part that is of the first semiconductor layer and that is exposed after the second dummy gate is removed, to change a shape of the exposed part of the first semiconductor layer includes: processing, by using the etching process, the fin that is exposed after the second dummy gate is removed, to change the shape of the exposed part of the first semiconductor layer.

Optionally, the fin is composed by one layer from the first semiconductor layer. The removing at least the second dummy gate, and processing a part that is of the fin and that is exposed after the second dummy gate is removed, to form an isolation section and further suppress current transfer in the part that is of the fin and that is exposed after the second dummy gate is removed includes: removing the second dummy gate, and processing the part that is of the fin and that is exposed after the second dummy gate is removed, to form the isolation section and further suppress the current transfer in the part that is of the fin and that is exposed after the second dummy gate is removed. After the isolation section is formed, the preparation method of the integrated circuit device further includes: removing the first dummy gates, and separately forming a gate dielectric layer and a gate at a location at which each of the second dummy gate and the first dummy gates is removed.

Optionally, the fin includes a plurality of first semiconductor layers and a plurality of second semiconductor layers. The first semiconductor layers and the second semiconductor layers are alternately disposed in the thickness direction of the substrate. Before the inter-layer insulating layer is formed, the preparation method of the integrated circuit device further includes: forming side walls on two sides of each of the second dummy gate and the first dummy gates in the gate length direction; removing the fin that is not covered by the first dummy gates, the side walls on the two sides of each of the first dummy gates, the second dummy gate, and the side walls on the two sides of the second dummy gate; and processing a region that is of the second semiconductor layer of the reserved fin and that is covered by the side walls, to form inner walls, and using, as a sacrificial layer, a remaining region that is not covered by the side walls. The removing at least the second dummy gate, and processing a part that is of the fin and that is exposed after the second dummy gate is removed includes: removing the first dummy gates, the second dummy gate, and the sacrificial layer, and processing the part that is of the fin and that is exposed after the second dummy gate is removed, to form the isolation section and further suppress the current transfer in the part that is of the fin and that is exposed after the second dummy gate is removed; forming a gate dielectric layer and a gate at a location at which each of the second dummy gate and the first dummy gates is removed; and forming, at a location of the sacrificial layer, a gate material layer and a gate dielectric material layer that is wrapped outside the gate material layer, and using the gate material layer and the gate dielectric material layer as an auxiliary layer.

BRIEF DESCRIPTION OF THE DRAWINGS

FIG. 5a is a schematic diagram of forming first dummy gates and a second dummy gate based on FIG. 4a;

FIG. 5b is a schematic sectional view in an A1A1' direction of FIG. 5a;

FIG. 5c is a schematic sectional view in a B1B1' direction of FIG. 5a;

FIG. 5d is a schematic sectional view in a C1C1' direction of FIG. 5a;

FIG. 6a is a schematic diagram of forming side walls based on FIG. 5a;

FIG. 6b is a schematic sectional view in an A2A2' direction of FIG. 6a;

FIG. 7a is a schematic diagram of forming a source and a drain based on FIG. 6a;

FIG. 7b is a schematic sectional view in an A3A3' direction of FIG. 7a;

FIG. 8a is a schematic diagram of forming an inter-layer insulating layer based on FIG. 7a;

FIG. 8b is a schematic sectional view in an A4A4' direction of FIG. 8a;

FIG. 9a is a schematic diagram of removing a second dummy gate based on FIG. 8a;

FIG. 9b is a schematic sectional view in an A5A5' direction of FIG. 9a;

FIG. 9c is a schematic sectional view in a B5B5' direction of FIG. 9a;

FIG. 10a is a schematic diagram of forming an isolation section based on FIG. 9a;

FIG. 10b is a schematic sectional view in an A6A6' direction of FIG. 10a;

FIG. 10c is a schematic sectional view in a B6B6' direction of FIG. 10a;

FIG. 11a is a schematic diagram of forming a gate dielectric layer and a gate based on FIG. 10a;

FIG. 11b is a schematic sectional view in an A7A7 direction of FIG. 11a;

FIG. 11c is a schematic sectional view in a B7B7' direction of FIG. 11a;

FIG. 11d is a schematic sectional view in a C7C7' direction of FIG. 11a;

FIG. 12 is a schematic flowchart of another preparation method of an integrated circuit device according to this application;

FIG. 13b is a schematic sectional view in a D1D1' direction of FIG. 13a;

FIG. 13c is a schematic sectional view in an E1E1' direction of FIG. 13a;

FIG. 13d is a schematic sectional view in an F1F1' direction of FIG. 13a;

FIG. 14a is a schematic diagram of forming side walls and removing a fin that is not covered by first dummy gates, side walls on two sides of each of the first dummy gates, a second dummy gate, and side walls on two sides of the second dummy gate based on FIG. 13a;

FIG. 14b is a schematic sectional view in a D2D2' direction of FIG. 14a;

FIG. 15a is a schematic diagram of forming a source and a drain based on FIG. 14a;

FIG. 15b is a schematic sectional view in a D3D3' direction of FIG. 15a;

FIG. 16a is a schematic diagram of forming an inter-layer insulating layer based on FIG. 15a;

FIG. 16b is a schematic sectional view in a D4D4' direction of FIG. 16a;

FIG. 17a is a schematic diagram of removing first dummy gates, a second dummy gate, and a sacrificial layer based on FIG. 16a;

FIG. 17b is a schematic sectional view in a D5D5' direction of FIG. 17a;

FIG. 17c is a schematic sectional view in an E5E5' direction of FIG. 17a;

FIG. 17d is a schematic sectional view in an F5F5' direction of FIG. 17a;

FIG. 19a is a schematic diagram of forming a gate dielectric layer and a gate based on FIG. 17a;

FIG. 19b is a schematic sectional view in a D7D7' direction of FIG. 19a;

FIG. 19c is a schematic sectional view in an E7E7' direction of FIG. 19a; and

FIG. 19d is a schematic sectional view in an F7F7' direction of FIG. 19a.

REFERENCE NUMERALS

10: a substrate; 20: a fin; 31: a first dummy gate; 32: a second dummy gate; 40: a side wall; 50: an active region; 51: a source; 52: a drain; 53: a channel region; 60: an inter-layer insulating layer; 70: an isolation section; 81: a first photosensitive layer; 82: a second photosensitive layer; 91: a gate dielectric layer; 92: a gate; 231: a first semiconductor layer; 232: a second semiconductor layer; 233: an inner wall; 234: a sacrificial layer; 235: an auxiliary layer; 2351: a gate material layer; 2352: a gate dielectric material layer; 100: a transistor.

DETAILED DESCRIPTION OF ILLUSTRATIVE EMBODIMENTS

Figure 1:
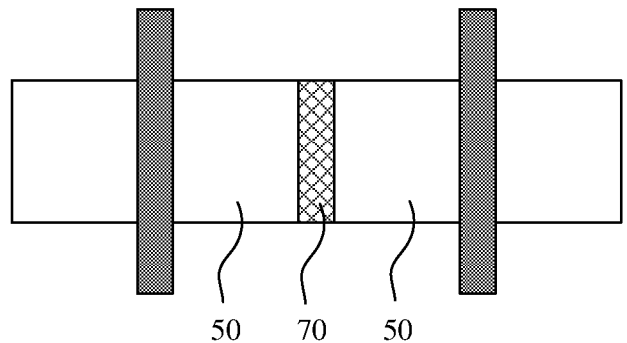
FIG. 1 is a schematic diagram of forming an isolation section between adjacent transistors in a conventional technology.
Figure 2:
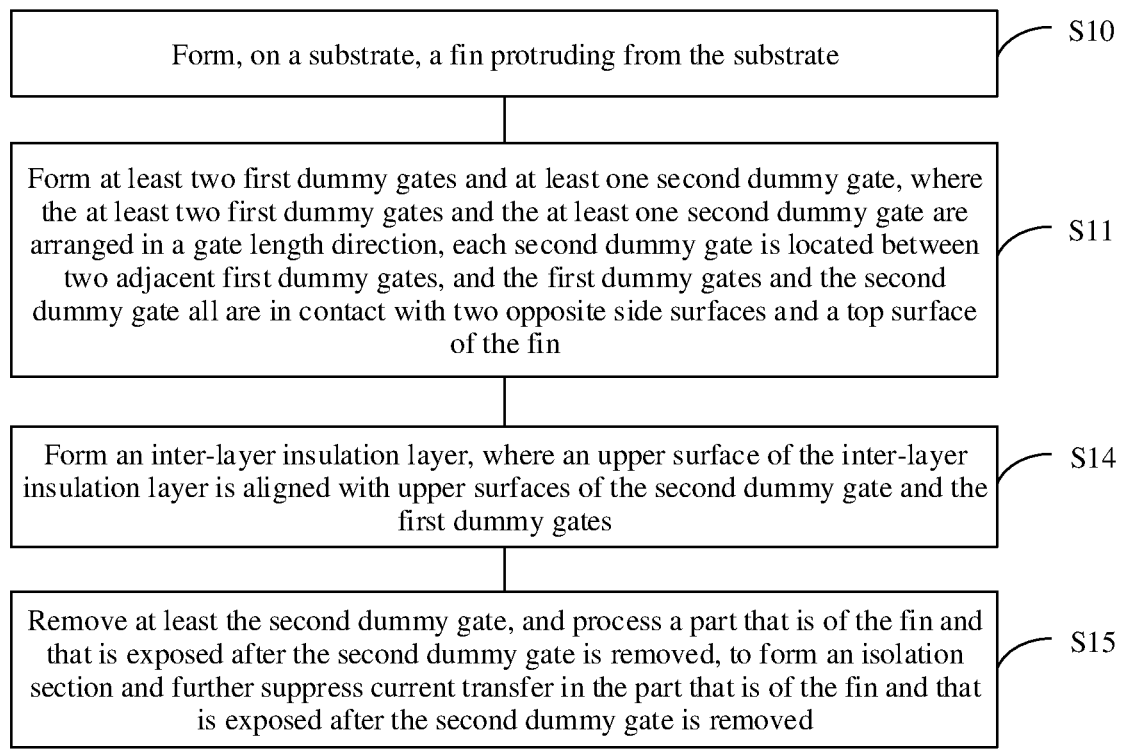
FIG. 2 is a schematic flowchart of a preparation method of an integrated circuit device according to this application.

An embodiment of this application provides a preparation method of an integrated circuit device. As shown in FIG. 2, the method includes the following steps.

Figure 4A:
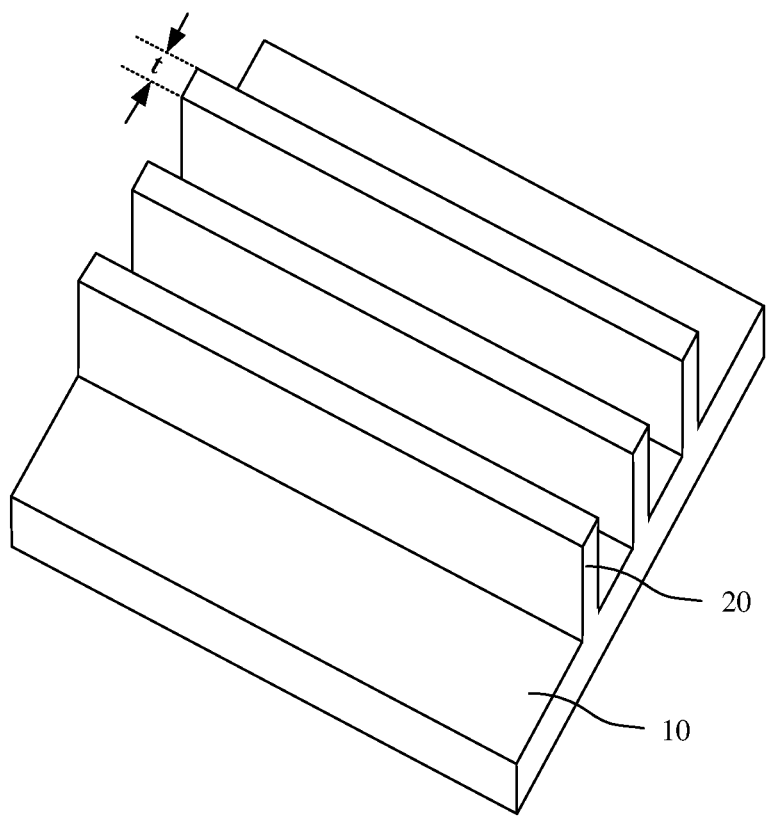
FIG. 4a is a schematic diagram of forming a fin on a substrate according to this application.

S10. As shown in FIG. 4a, form, on a substrate 10, a fin 20 protruding from the substrate 10.

There may be one or more fins 20. When there are a plurality of fins 20, the plurality of fins 20 may be divided into a plurality of groups. Each group includes at least one fin 20. When each group includes a plurality of fins 20, the plurality of fins 20 are disposed in parallel. A thickness t of the fin 20 may be at a nanometer level. A thickness direction of the fin 20 is perpendicular to a gate length direction and a thickness direction of the substrate 10.

For a shape of the fin 20, for example, the shape may be basically rectangular. In this case, the fin 20 has four side surfaces vertically extending from an upper surface of the substrate 10, and a top surface located above the four side surfaces. The top surface may be basically parallel to the upper surface of the substrate 10.

Figure 4B:
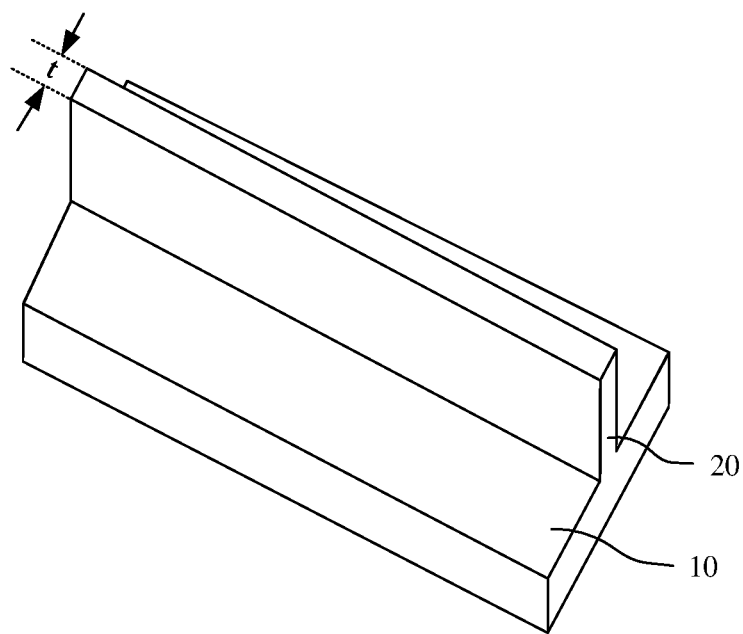
FIG. 4b is another schematic diagram of forming a fin on a substrate according to this application.

FIG. 4a shows a group including three fins 20. However, this application is not limited thereto. For example, as shown in FIG. 4b, one group may alternatively include only one fin 20. FIG. 4a and FIG. 4b show only one group of fins 20 formed on the substrate 10. However, this application is not limited thereto. This may be determined according to a specific design of an integrated circuit device.

The preparation method of the integrated circuit device provided in this embodiment of this application is described by using an example in which the three fins 20 are formed on the substrate 10 and the three fins 20 form one group.

Figure 5A:
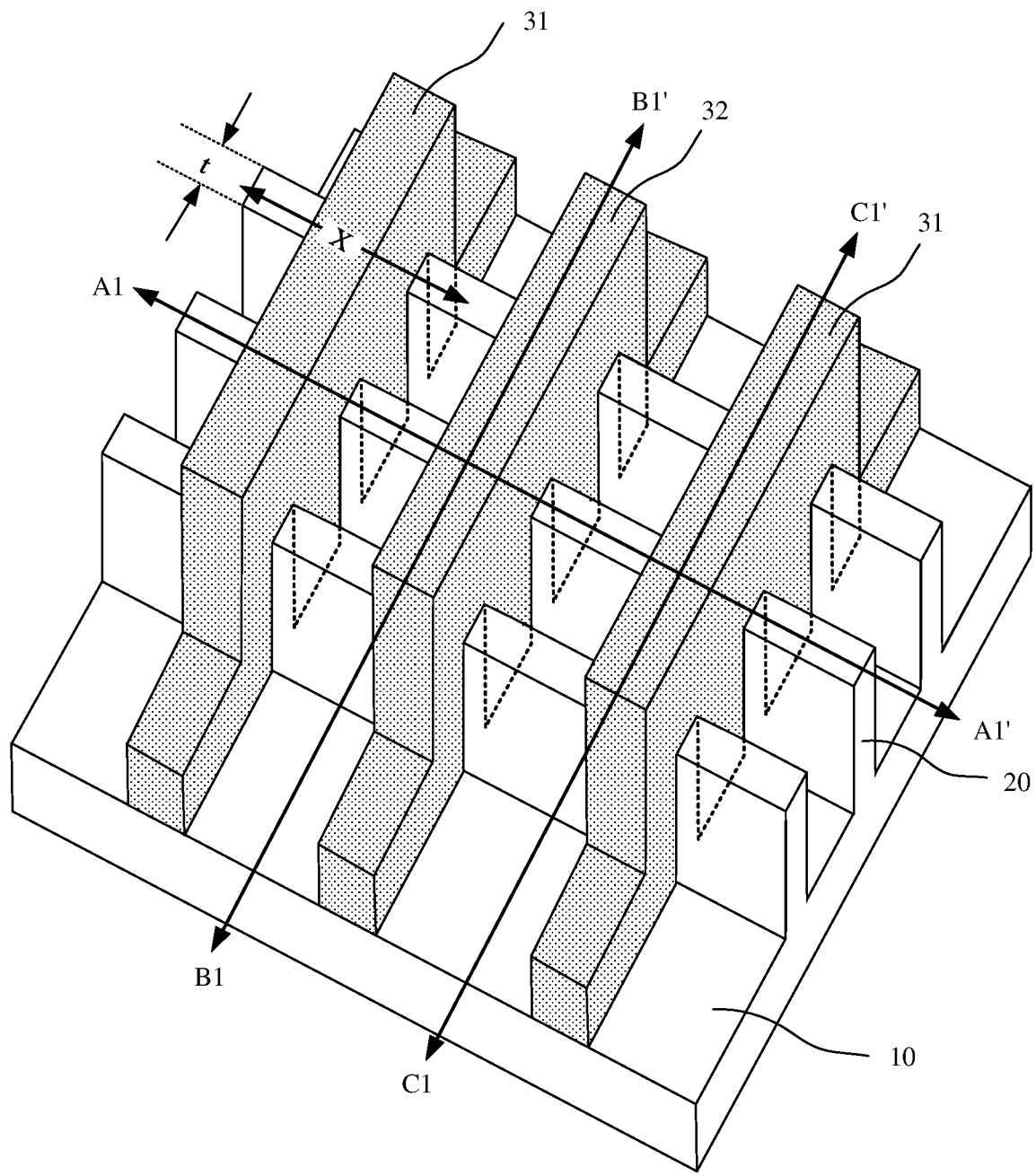
Figure 5B:
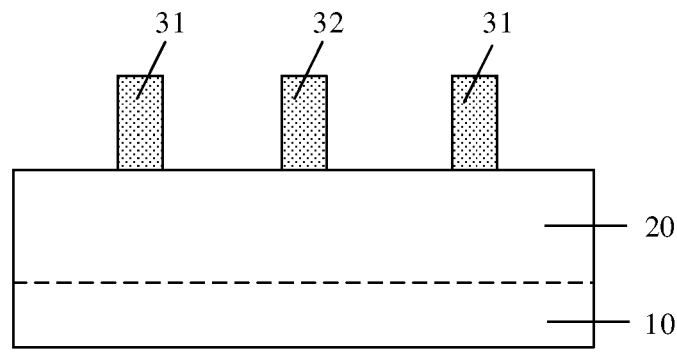
Figure 5C:
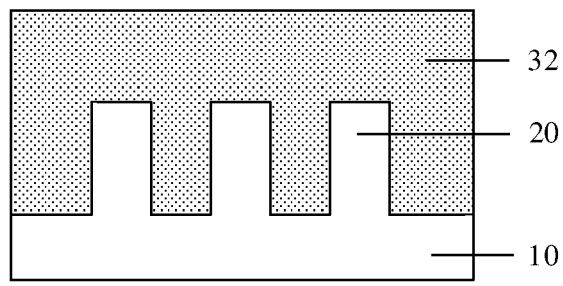
Figure 5D:
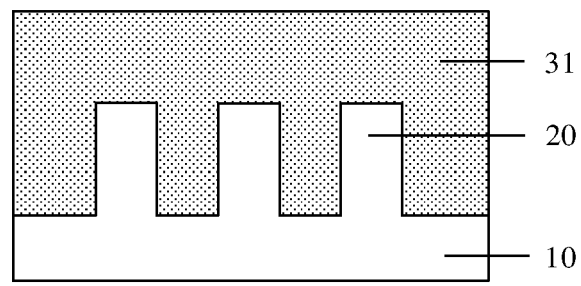
Figure 13A:
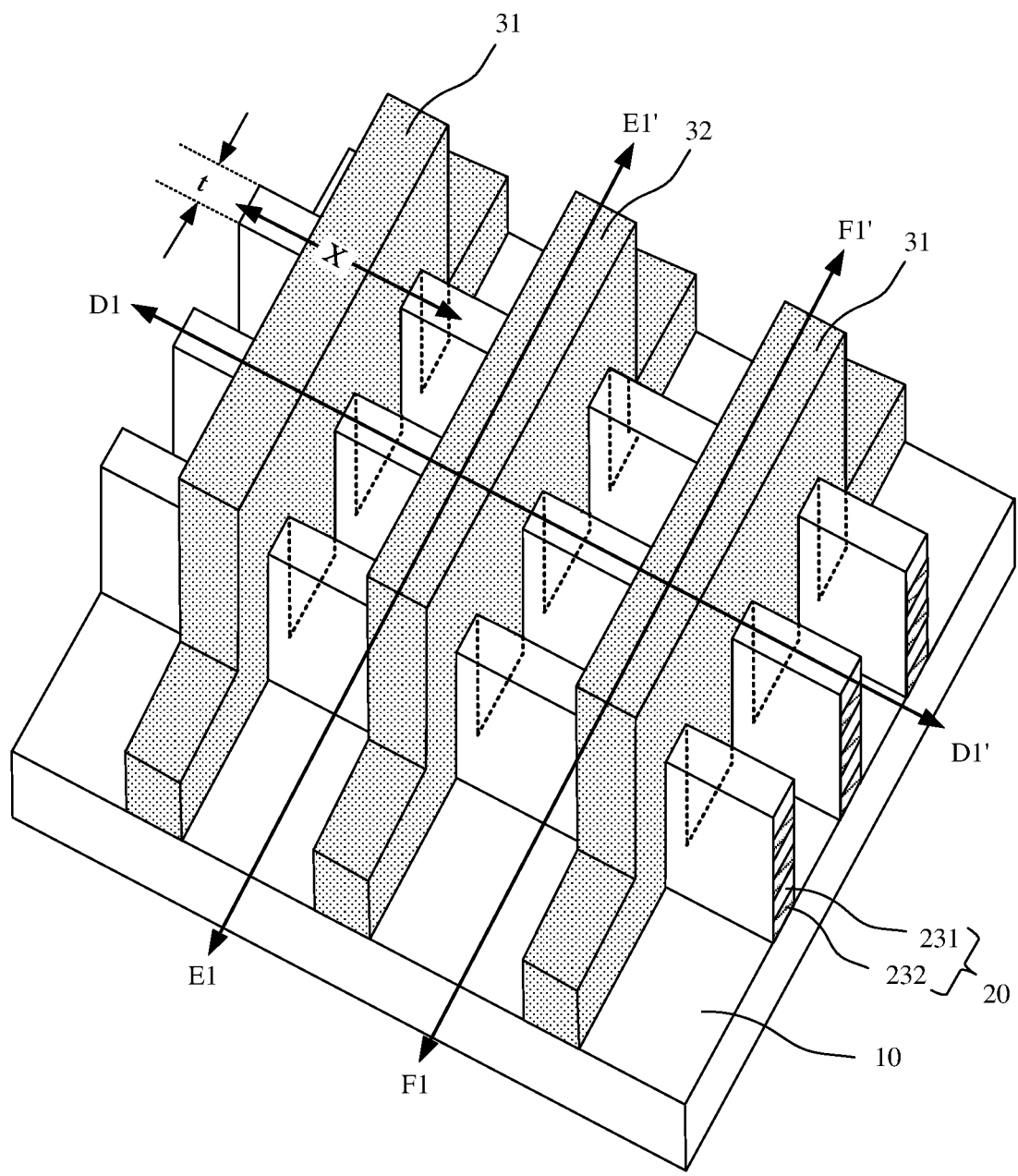
FIG. 13a is a schematic diagram of forming a fin, first dummy gates, and a second dummy gate on a substrate according to this application.
Figure 13B:
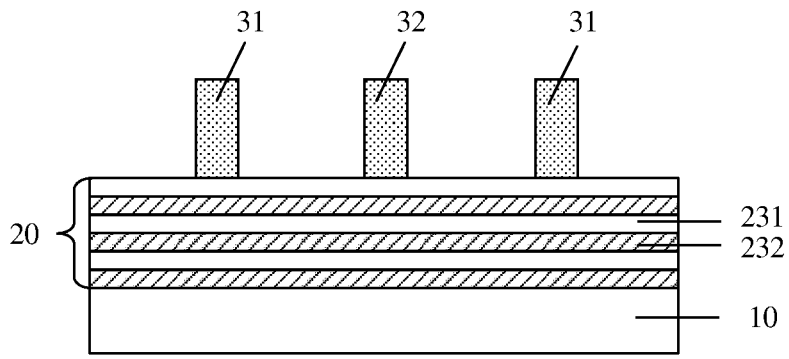
Figure 13C:
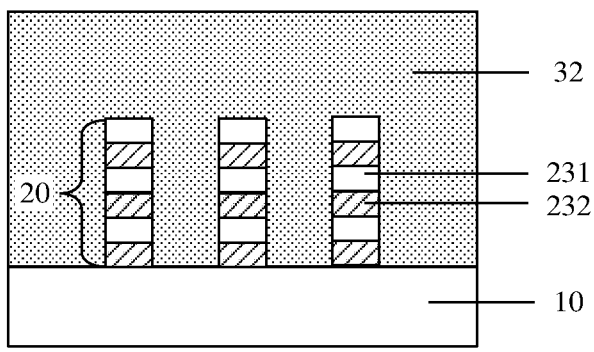
Figure 13D:
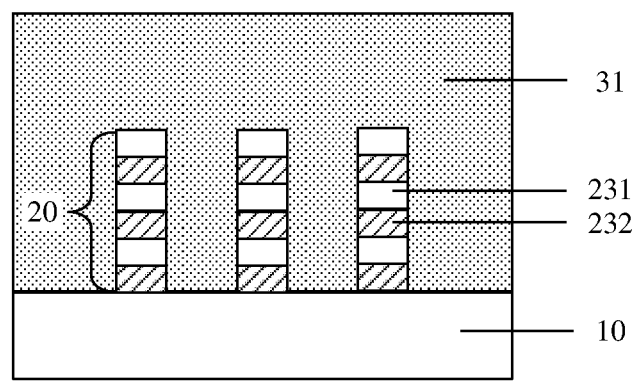

S11. As shown in FIG. 5a or FIG. 13a, form at least two first dummy gates 31 and at least one second dummy gate 32, where the at least two first dummy gates 31 and the at least one second dummy gate 32 are arranged in a gate length direction X, each second dummy gate 32 is located between two adjacent first dummy gates 31, and the first dummy gates 31 and the second dummy gate 32 all are in contact with two opposite side surfaces and the top surface of the fin 20.

For example, for the first dummy gates 31 and the second dummy gate 32, in the direction of the thickness t of the fin 20, the first dummy gates 31 and the second dummy gate 32 all cross each fin 20 in the group, and are in contact with the two side surfaces that are of each fin 20 and that are perpendicular to the thickness direction of the fin 20 and the top surface between the two side surfaces.

When a plurality of groups of fins 20 are formed on the substrate 10, the first dummy gates 31 and the second dummy gate 32 that cross each group of fins 20 are not connected.

In a plane parallel to the top surface of the fin 20, the thickness direction of the fin 20 is perpendicular to the gate length direction X. Because the top surface of the fin 20 is basically parallel to the upper surface of the substrate 10, the thickness direction of the fin 20 is also perpendicular to the gate length direction X in a plane of the upper surface of the substrate 10.

For the "first dummy gate" and the "second dummy gate", a reason for calling the two parts "dummy gate" is that the "first dummy gate" and the "second dummy gate" are both removed to form real gates in a finally prepared integrated circuit device.

Figure 8A:
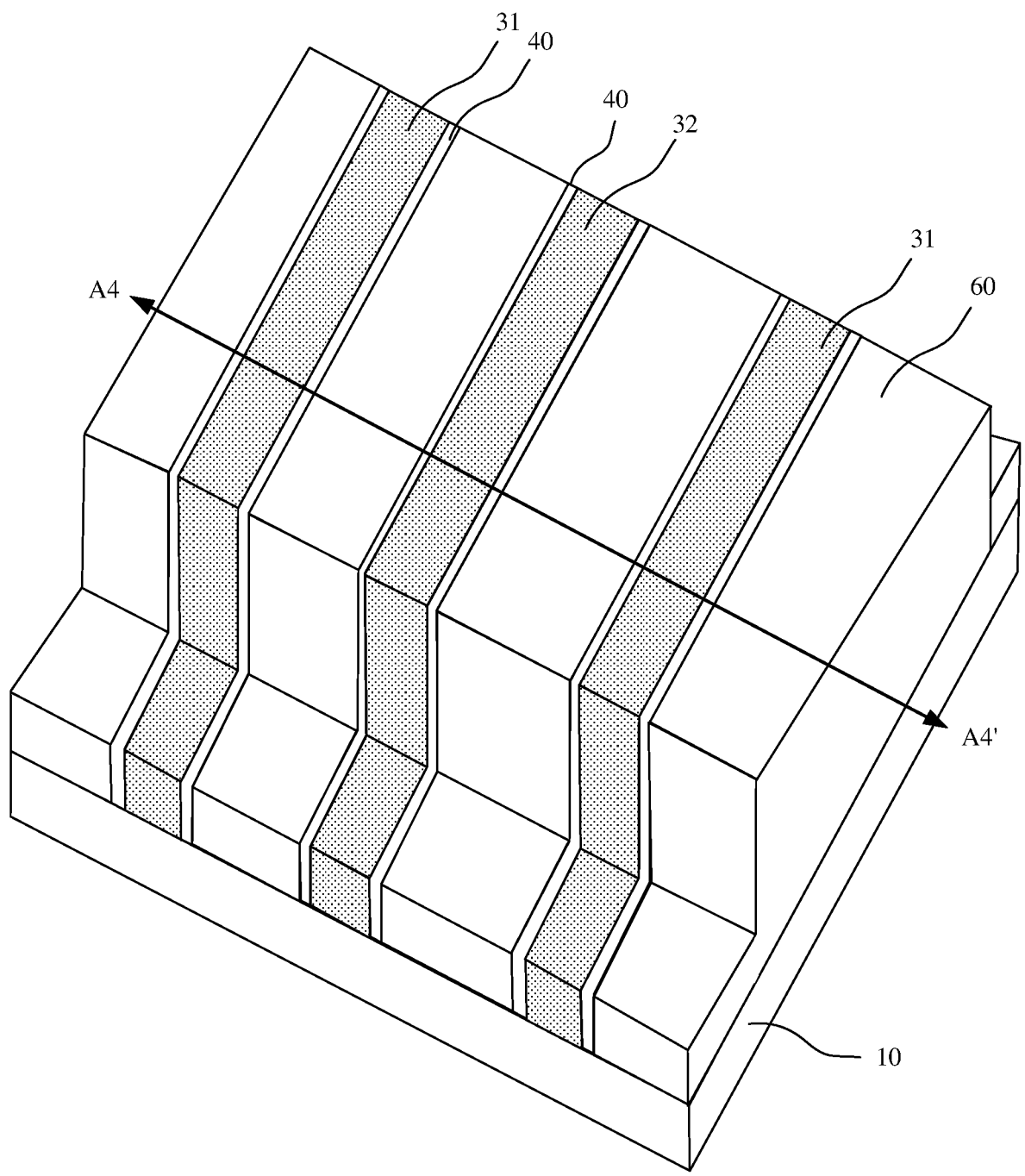
Figure 16A:
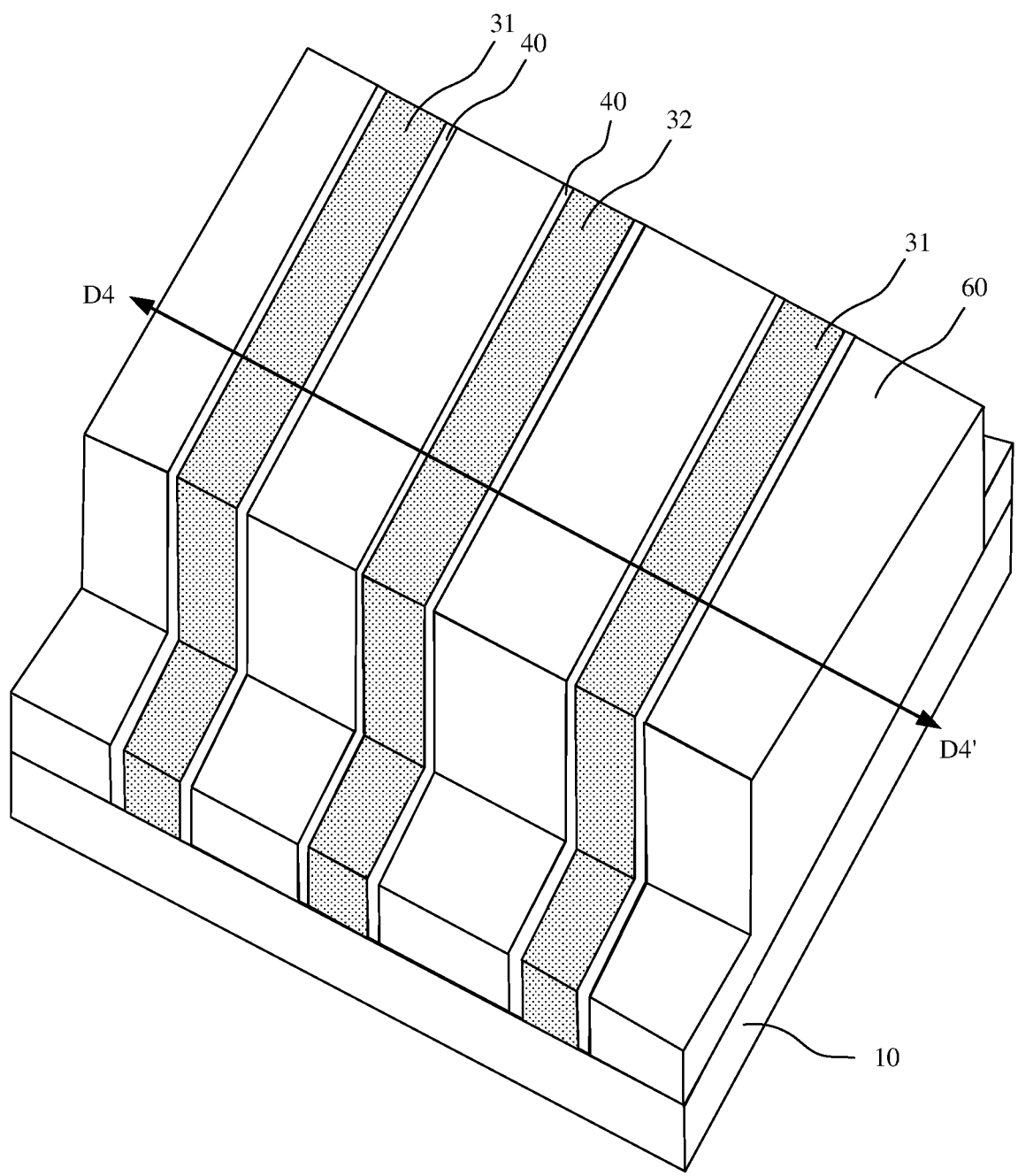

S14. As shown in FIG. 8a or FIG. 16a, form an inter-layer insulating layer 60. An upper surface of the inter-layer insulating layer 60 is aligned with upper surfaces of the second dummy gate 32 and the first dummy gates 31.

S15. As shown in FIG. 9a to FIG. 9c, or FIG. 10a to FIG. 10c, or FIG. 17a and FIG. 18a to FIG. 18c, remove at least the second dummy gate 32, and process a part that is of the fin 20 and that is exposed after the second dummy gate 32 is removed, to form an isolation section 70 and further suppress current transfer in the part that is of the fin 20 and that is exposed after the second dummy gate 32 is removed.

In other words, the isolation section 70 has a function of suppressing the current transfer within the isolation section 70.

Optionally, the part that is of the fin 20 and that is exposed after the second dummy gate 32 is removed may be processed in the following two manners:

Manner 1: Dope, with inert atoms by using one process of plasma trimming, plasma doping, or ion doping, the part that is of the fin 20 and that is exposed after the second dummy gate 32 is removed, to insulate at least a part of the exposed part of the fin 20 and further form the isolation section 70.

The inert atoms herein are different from common impurity atoms. A quantity of valence electrons of a common impurity atom is 3 or 5. The common impurity atom can be ionized in a silicon lattice. An impurity atom that generates a free electron is referred to as a donor, and an impurity atom that generates a free hole is referred to as an acceptor. The inert atoms are doped into a silicon lattice, so that a function of destroying the silicon lattice and a semiconductor band structure to suppress carrier generation is achieved. For example, the inert atoms include at least one type of hydrogen atoms (H), oxygen atoms (O), nitrogen atoms (N), carbon atoms (C), or silicon atoms (Si).

Manner 2: Process, by using an etching process, at least a part of the part that is of the fin 20 and that is exposed after the second dummy gate 32 is removed, to change a shape of the exposed fin 20 and further form the isolation section 70.

For example, at least the part of the part that is of the fin 20 and that is exposed after the second dummy gate 32 is removed may be processed by using a hydrogen baking ($H_2$ baking) process, to change the shape of the exposed fin 20. Herein, the H2 baking process belongs to vapor-phase etching and surface treatment technologies.

The shape change includes reducing a thickness of the exposed fin 20 in a direction perpendicular to the gate length direction X or the thickness direction of the substrate 10, or changing the shape of the exposed fin 20.

Figure 6A:
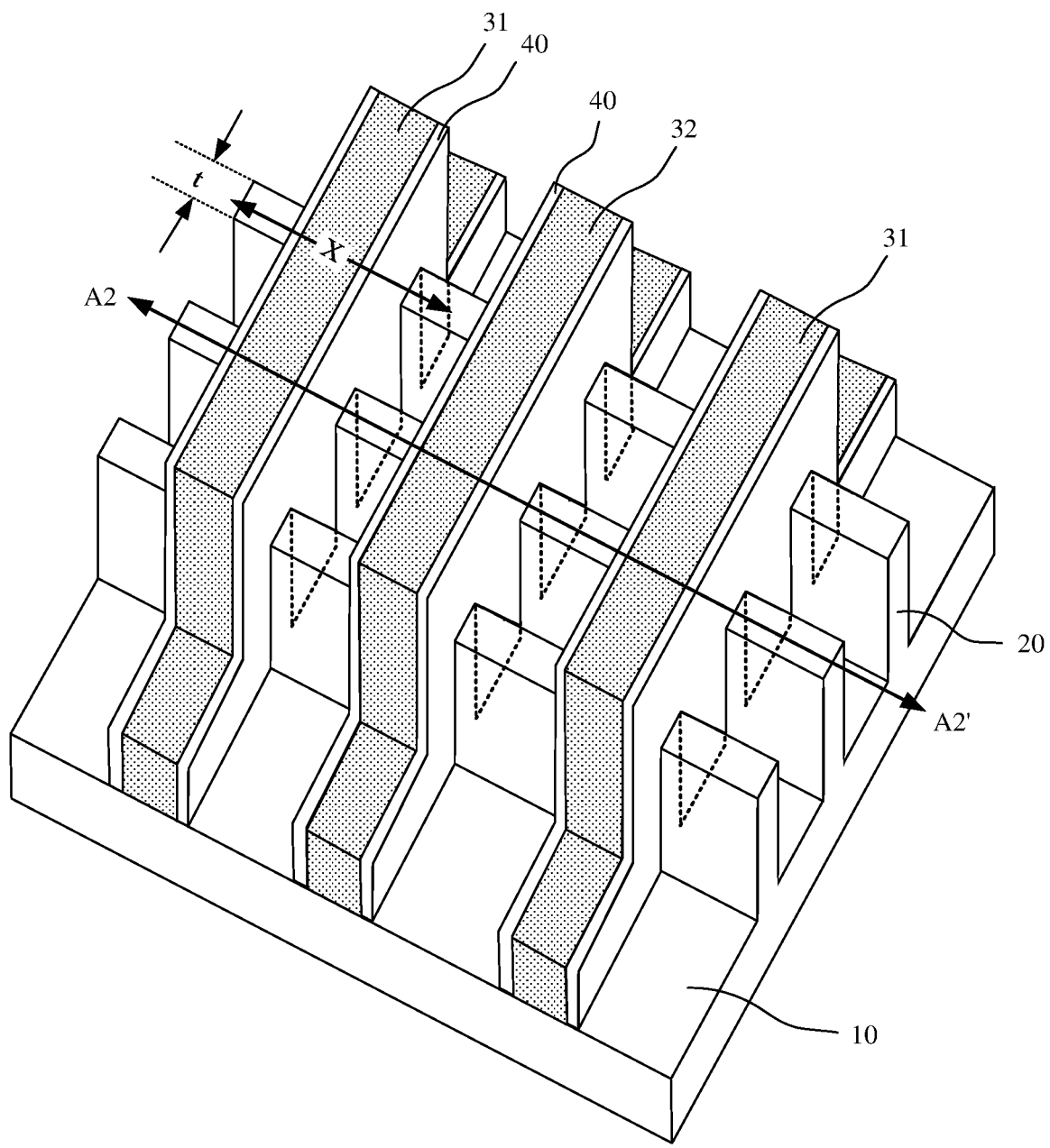
Figure 14A:
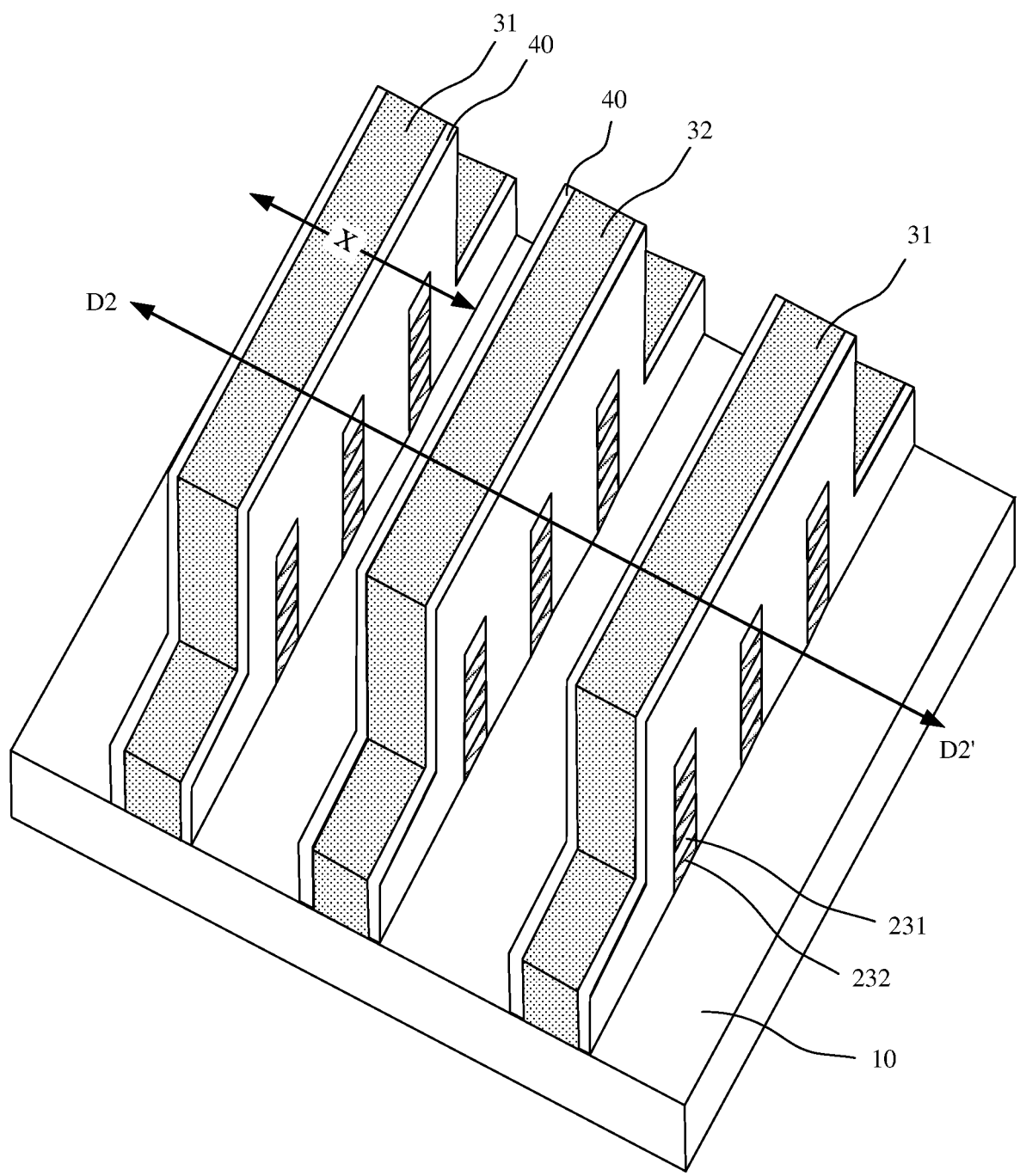

In some embodiments, before the inter-layer insulating layer 60 is formed, side walls 40, a source 51, and a drain 52 need to be formed. The preparation method of the integrated circuit device further includes the following steps:

S12. As shown in FIG. 6a or FIG. 14a, form the side walls 40 on two sides of each of the second dummy gate 32 and the first dummy gates 31 in the gate length direction X.

S13. As shown in FIG. 7a and FIG. 7b, or FIGS. 15a and 15b, respectively form the source 51 and the drain 52 on the two sides of each first dummy gate 31 in the gate length direction X.

Figure 10A:
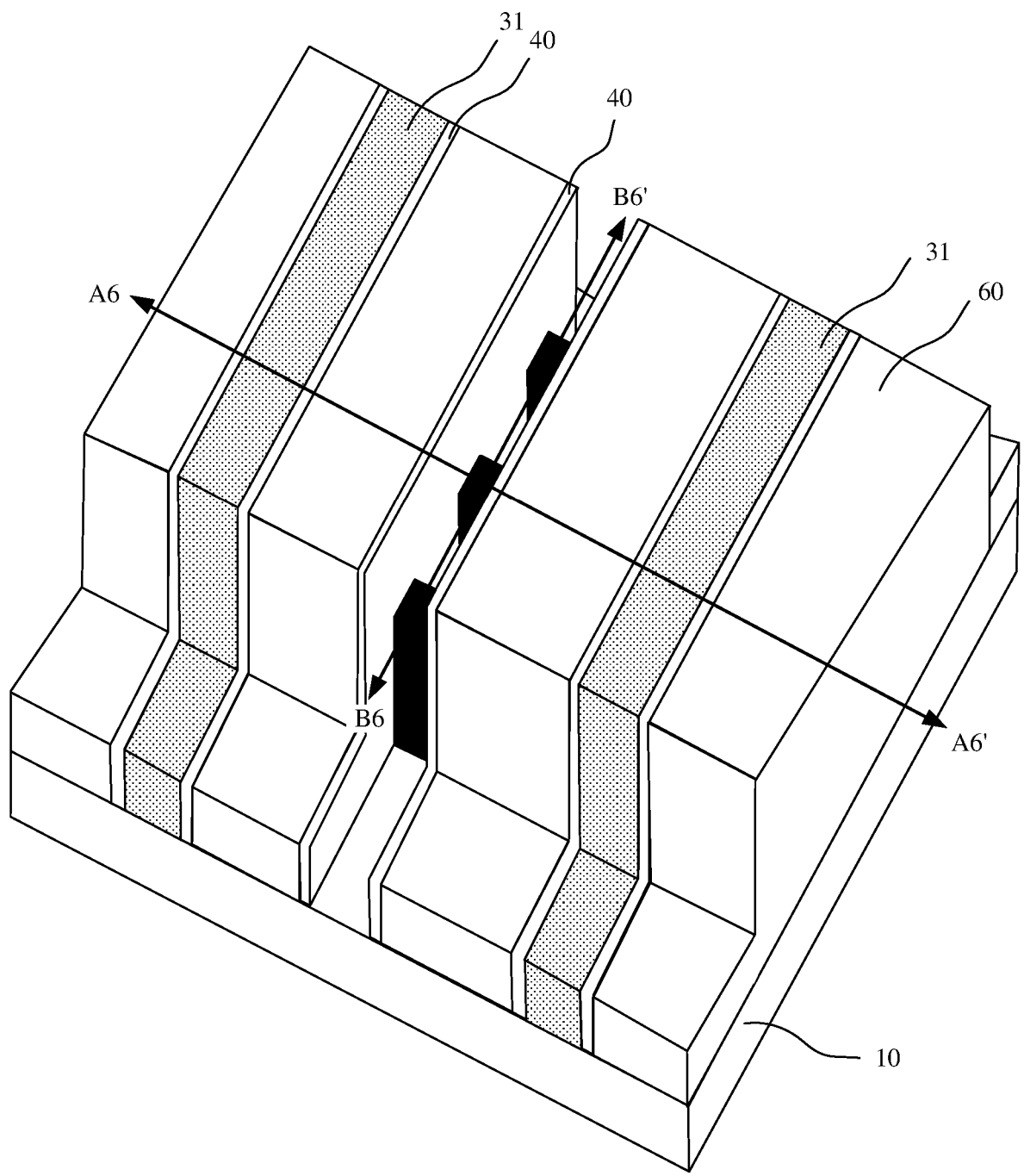
Figure 10B:
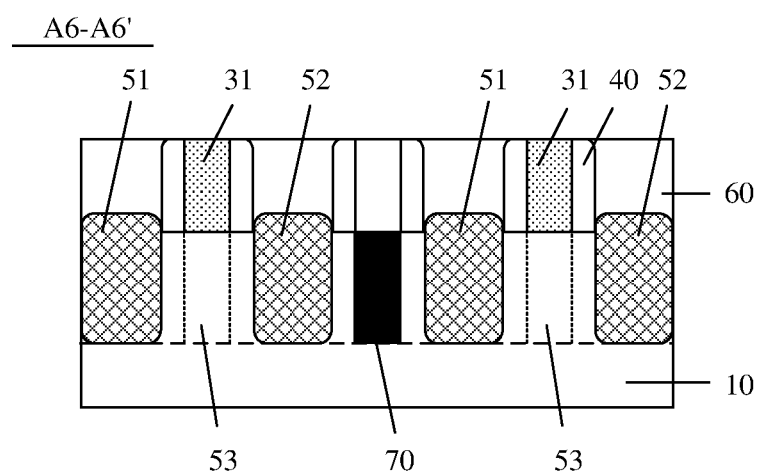

Based on the foregoing steps, as shown in FIG. 10b, when the source 51 and the drain 52 are respectively formed on the two sides of each first dummy gate 31 in the gate length direction X, a region that is of the fin 20 and that is covered by the first dummy gate 31 becomes a channel region 53.

On this basis, the integrated circuit device includes a plurality of transistors. For each transistor, the transistor includes a gate, a source 51, and a drain 52. The region that is covered by the gate between the source 51 and the drain 52 becomes the channel region 53. It may be learned that one transistor may be formed on each of the two sides of the second dummy gate 32.

After the second dummy gate 32 is removed, a real gate is also formed at a location of the second dummy gate 32. The isolation section 70 is formed after the part that is of the fin 20 and that is exposed after the second dummy gate 32 is removed. A purpose of forming the isolation section 70 is to suppress a leakage current path of the two transistors on two sides of the isolation section 70. Therefore, the isolation section 70 is basically insulated. It may be learned that the real gate formed at the location of the second dummy gate 32 does not have a normal channel enabling feature.

It should be noted that the words such as the "upper surface" and the "top surface" mentioned in this application each mean a side surface of a corresponding structure distant from the substrate 10. For example, the upper surface of the inter-layer insulating layer 60 means an upper surface, distant from the substrate 10, of the inter-layer insulating layer 60. An upper surface of the first dummy gate 31 means an upper surface, distant from the substrate 10, of the first dummy gate 31.

In the preparation method of the integrated circuit device provided in this application, after the inter-layer insulating layer 60 is formed, the upper surfaces of the second dummy gate 32 and the first dummy gates 31 are exposed. Therefore, the second dummy gate 32 may be removed by using a simple process. In this way, the part that is of the fin 20 and that is exposed after the second dummy gate 32 is removed may be processed to form the isolation section for suppressing the leakage current path of the two adjacent transistors. When the isolation section 70 is formed in this manner, the following advantages are obtained: For example, structures and stress of the transistors on the two sides of the isolation section 70 are lightly affected, an introduced variation of a device feature parameter is minimum, an area resource occupied by the isolation section 70 is relatively small, and a special winding resource does not need to be designed.

In a single diffusion break (SDB) technology and a double diffusion break (DDB) technology, the leakage current path is suppressed by forming a groove and filling the groove with insulating materials. This causes a large stress change and a large variation between parameters of adjacent transistors. In a manner of forming the isolation section 70 in a process of preparing the integrated circuit device provided in this application, structural integrity of the part that is of the fin 20 and that is exposed after the second dummy gate 32 is removed may be all or partially maintained. This causes a relatively small stress change.

For swap N/P work function metal (SWAP N/P work function metal, SWAP N/P), SWAP N/P is essentially used to set a relatively high threshold voltage of an isolation device, so that a leakage current of the isolation device is suppressed as much as possible. This is essentially an electrical shutdown. However, SWAP N/P causes a more complex integration procedure of a metal gate work function, and a restricted design rule limits use of SWAP N/P. In the manner of forming the isolation section 70 in the process of preparing the integrated circuit device provided in this application, the integration procedure of the metal gate work function does not become complex.

A gate tie is essentially enabling a P-type isolation device or an N-type isolation device to be in a forced shutdown state on a fixed high voltage (VDD) or a fixed low voltage (VSS) of a gate potential of the isolation device. However, the gate tie occupies more contact resources and winding resources in a design. In comparison with the gate tie, an electric potential of the gate is not required in the manner of forming the isolation section 70 in the process of preparing the integrated circuit device provided in this application.

Figure 3:
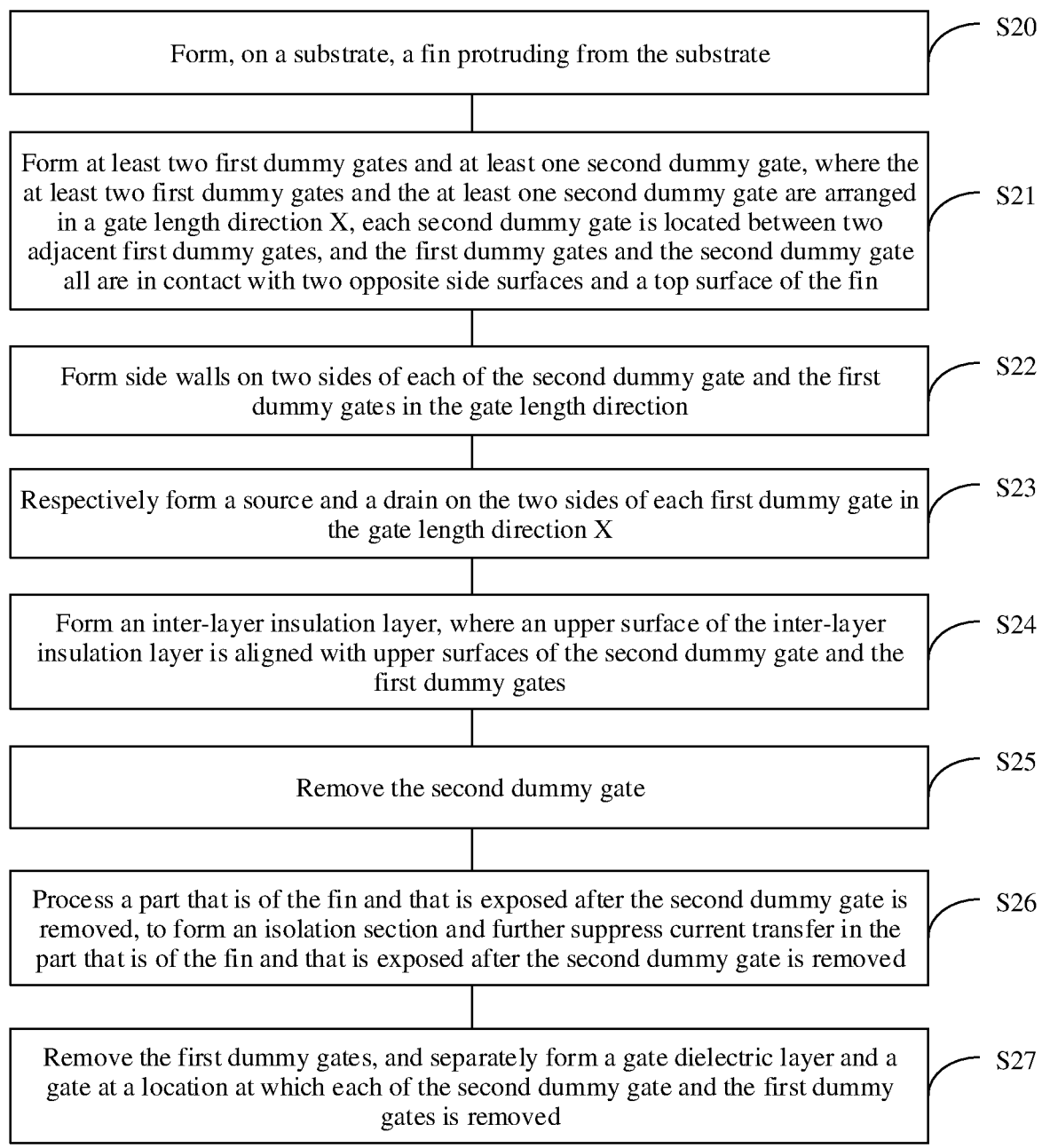
FIG. 3 is a schematic flowchart of another preparation method of an integrated circuit device according to this application.

For example, the integrated circuit device includes a fin field-effect transistor (FinFET). An embodiment of this application further provides another preparation method of an integrated circuit device. As shown in FIG. 3, the method includes the following steps.

S20. As shown in FIG. 4a, form, on a substrate 10, a fin 20 protruding from the substrate 10.

In some embodiments, the substrate 10 and the fin 20 are formed through performing etching on a semiconductor substrate. To be specific, a trench is formed in the semiconductor substrate by using a process such as photolithography or etching, a protruding part between adjacent trenches forms the fin 20, and a semiconductor substrate located at the bottom of the fin 20 forms the substrate 10.

In this case, the substrate 10 and the fin 20 are made of the same material. The material of the substrate 10 and the fin 20 may be one of bulk silicon, silicon germanium, silicon carbide, silicon on insulator (SOI), or germanium silicon on insulator (SGOI).

In some other embodiments, the fin 20 is formed on an upper surface of the substrate 10 by using an epitaxy process.

On this basis, a manner of forming the fin 20 is: epitaxially growing a semiconductor film layer on the upper surface of the substrate 10, etching the semiconductor film layer until the upper surface of the substrate 10 is exposed, forming a trench in the semiconductor film layer, and forming the fin 20 by using a protruding part between adjacent trenches.

Another manner of forming the fin 20 is: forming an isolation layer on the upper surface of the substrate 10, etching the isolation layer until the upper surface of the substrate 10 is exposed, and forming a trench in the isolation layer. On this basis, the fin 20 is epitaxially grown and formed in the trench. After the fin 20 is formed, the isolation layer is etched, so that a surface of the isolation layer is lower than a top surface of the fin 20.

A material of the substrate 10 may be one of bulk silicon, silicon germanium, silicon carbide, SOI, or GOI. A material of the fin 20 may be one of silicon, silicon germanium, germanium, or silicon carbide. The material of the fin 20 is the same as or different from the material of the substrate 10.

S21. As shown in FIG. 5a, FIG. 5b, FIG. 5c, and FIG. 5d, form at least two first dummy gates 31 and at least one second dummy gate 32, where the at least two first dummy gates 31 and the at least one second dummy gate 32 are arranged in a gate length direction X, each second dummy gate 32 is located between two adjacent first dummy gates 31, and the first dummy gates 31 and the second dummy gate 32 all are in contact with two opposite side surfaces and the top surface of the fin 20.

In this embodiment of this application, the first dummy gate 31 is used to occupy space and locations for a subsequently formed real gate and gate dielectric layer. Therefore, the first dummy gate 31 needs to be subsequently removed. For the second dummy gate 32, a main purpose of the second dummy gate 32 is to form an isolation section 70 in a subsequent process. Therefore, a size of the second dummy gate 32 may be determined based on a size of the isolation section 70.

The first dummy gates 31 and the second dummy gate 32 may be made of a same material. The material of the first dummy gates 31 and the second dummy gate 32 may be at least one of polycrystalline silicon, amorphous silicon, or amorphous carbon. Materials such as the polycrystalline silicon, the amorphous silicon, and the amorphous carbon are easy to be etched and removed and have good shape maintenance. Therefore, when the first dummy gates 31 and the second dummy gate 32 are formed by using at least one of the polycrystalline silicon, the amorphous silicon, or the amorphous carbon, the first dummy gates 31 and the second dummy gate 32 can be easily removed and have good shapes and stable structures.

The first dummy gates 31 and the second dummy gate 32 may be simultaneously prepared by using photolithography and etching processes.

Figure 6B:
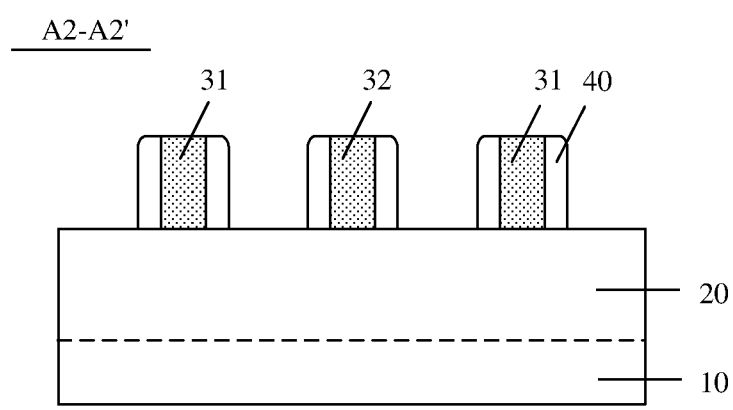

S22. As shown in FIG. 6a and FIG. 6b, form side walls 40 on two sides of each of the second dummy gate 32 and the first dummy gates 31 in the gate length direction X.

The side walls 40 have a function of protecting the first dummy gates 31 and the second dummy gate 32. In addition, in a subsequent process of forming a source and a drain, a source and a drain are respectively formed on the two sides of the first dummy gate 31 in a self-aligned manner of the first dummy gates 31 and the second dummy gate 32.

A material of the side walls 40 may be silicon nitride ($Si_3N_4$), silicon oxynitride (SiON), or the like. The side walls 40 may be formed, for example, by using an isotropic deposition and anisotropic etching method.

Figure 7A:
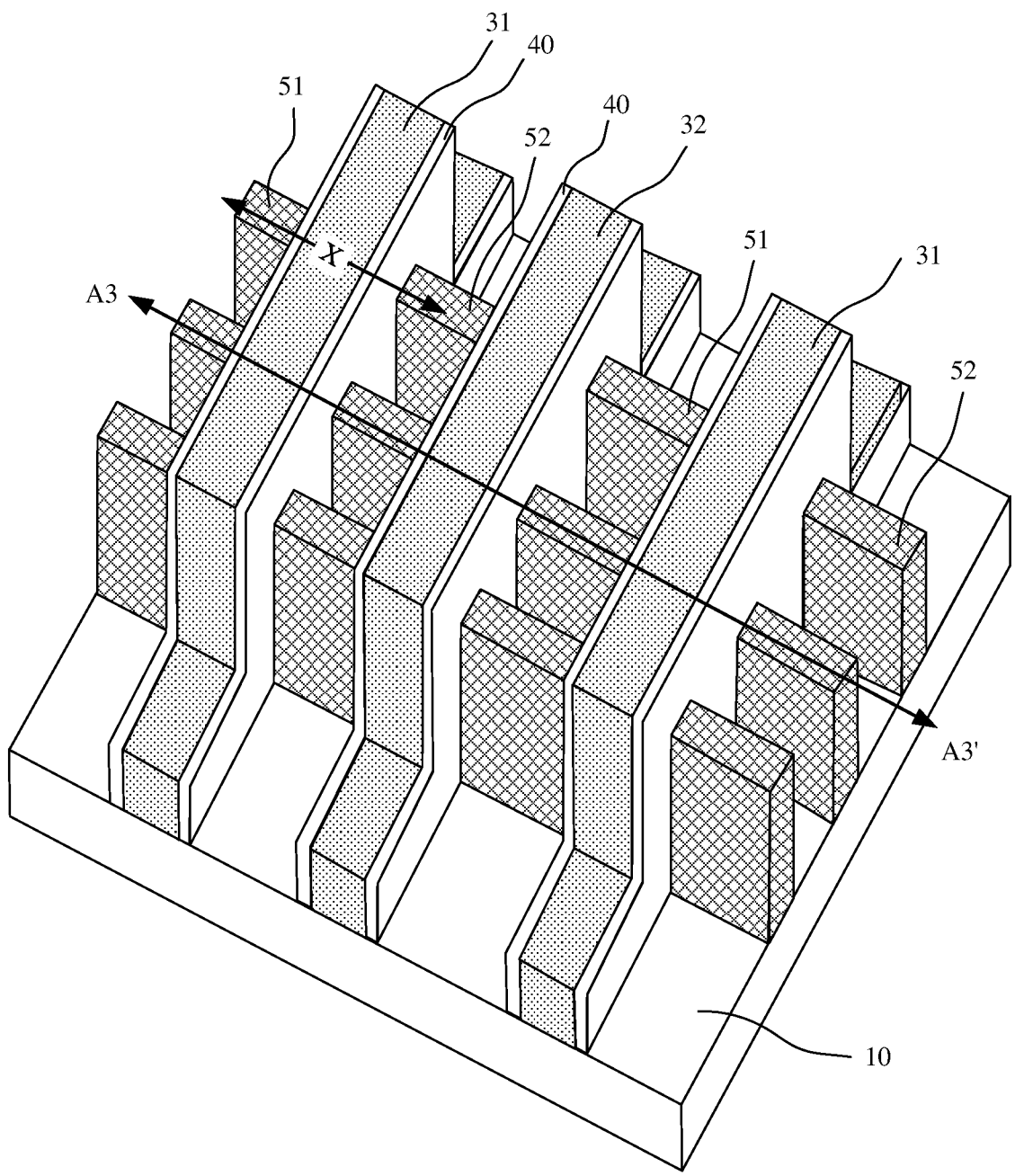
Figure 7B:
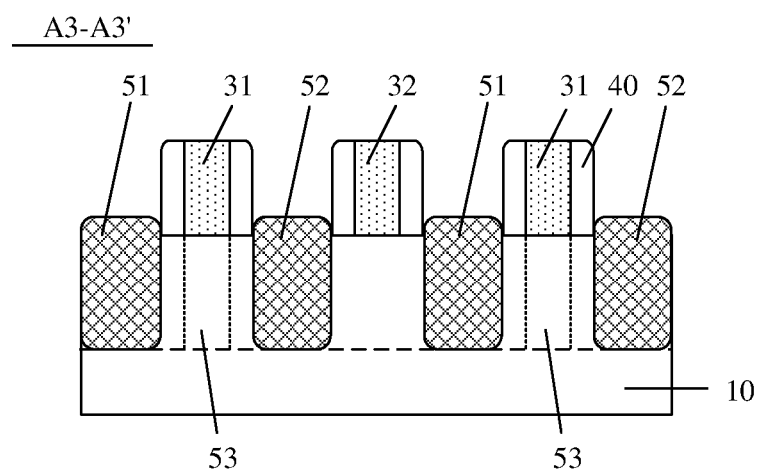

S23. As shown in FIG. 7a and FIG. 7b, respectively form a source 51 and a drain 52 on the two sides of each first dummy gate 31 in the gate length direction X.

A person skilled in the art understands that the source 51 and the drain 52 are formed in a region that is of the fin 20 and that is not covered by the first dummy gates 31, the side walls 40 on the two sides of each of the first dummy gates 31, the second dummy gate 32, and the side walls on the two sides of the second dummy gate 32.

For the first dummy gate 31 on one side of the second dummy gate 32, when the source 51 and the drain 52 are respectively formed on the two sides of the first dummy gate 31 in the gate length direction X, one of the source 51 or the drain 52 is located between the first dummy gate 31 and the second dummy gate 32. Similarly, for the first dummy gate 31 on the other side of the second dummy gate 32, when the source 51 and the drain 52 are respectively formed on the two sides of the first dummy gate 31 in the gate length direction X, one of the source 51 or the drain 52 is located between the first dummy gate 31 and the second dummy gate 32.

It can be learned that, as shown in FIG. 7b, a region that is of the fin 20 and that is covered by the first dummy gate 31 becomes a channel region 53. A projection of the channel region 53 on the substrate 10 overlaps a projection of the first dummy gate 31 on the substrate 10.

After step S23, the source 51, the drain 52, and the channel region 53 of a FinFET have been formed on one side of the second dummy gate 32 in the gate length direction X. Similarly, the source 51, the drain 52, and the channel region 53 of an FinFET have been formed on the other side of the second dummy gate 32 in the gate length direction X.

When an N-type FinFET is formed, germanium silicon (SiGe) containing boron (B) may be epitaxially grown on the two sides of the first dummy gate 31 in the gate length direction X by using a selective epitaxy process, to form the source 51 and the drain 52. When a P-type FinFET is formed, silicon (Si) containing phosphorus (P) may be epitaxially grown on the two sides of the first dummy gate 31 in the gate length direction X by using a selective epitaxy process, to form the source 51 and the drain 52.

It should be noted that FIG. 7a is a schematic diagram of separately forming a plurality of sources 51 and a plurality of drains 52 on the two sides of the first dummy gates 31 in the gate length direction X ("a plurality of" herein may be consistent with a quantity of fins 20). However, this application is not limited thereto. Alternatively, a plurality of sources 51 on one side of the first dummy gates 31 in the gate length direction X may be combined into one source 51, and a plurality of drains 52 on the other side of the first dummy gates 31 in the gate length direction X may be combined into one drain 52.

Figure 8B:
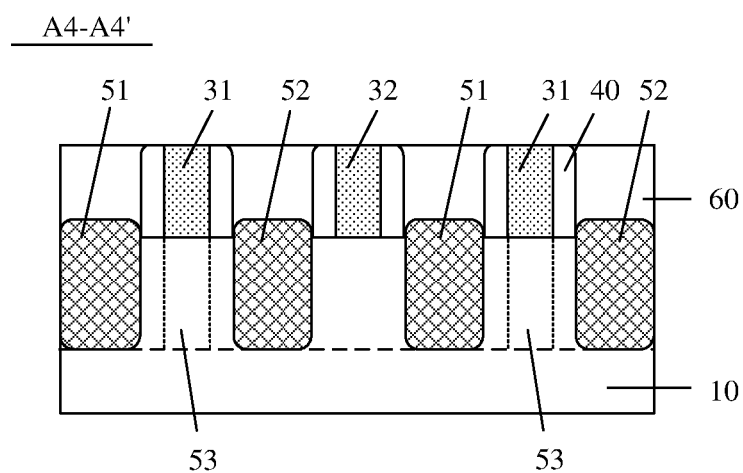

S24. As shown in FIG. 8a and FIG. 8b, form an inter-layer insulating layer 60. An upper surface of the inter-layer insulating layer 60 is aligned with upper surfaces of the second dummy gate 32 and the first dummy gates 31.

Optionally, an insulating material may be deposited. For example, the insulating material may be silicon oxide or silicon nitride. The upper surface of the inter-layer insulating layer 60 is aligned with the upper surfaces of the second dummy gate 32 and the first dummy gates 31 by using a chemical mechanical polishing (CMP) process, to expose the second dummy gate 32 and the first dummy gates 31.

Figure 9A:
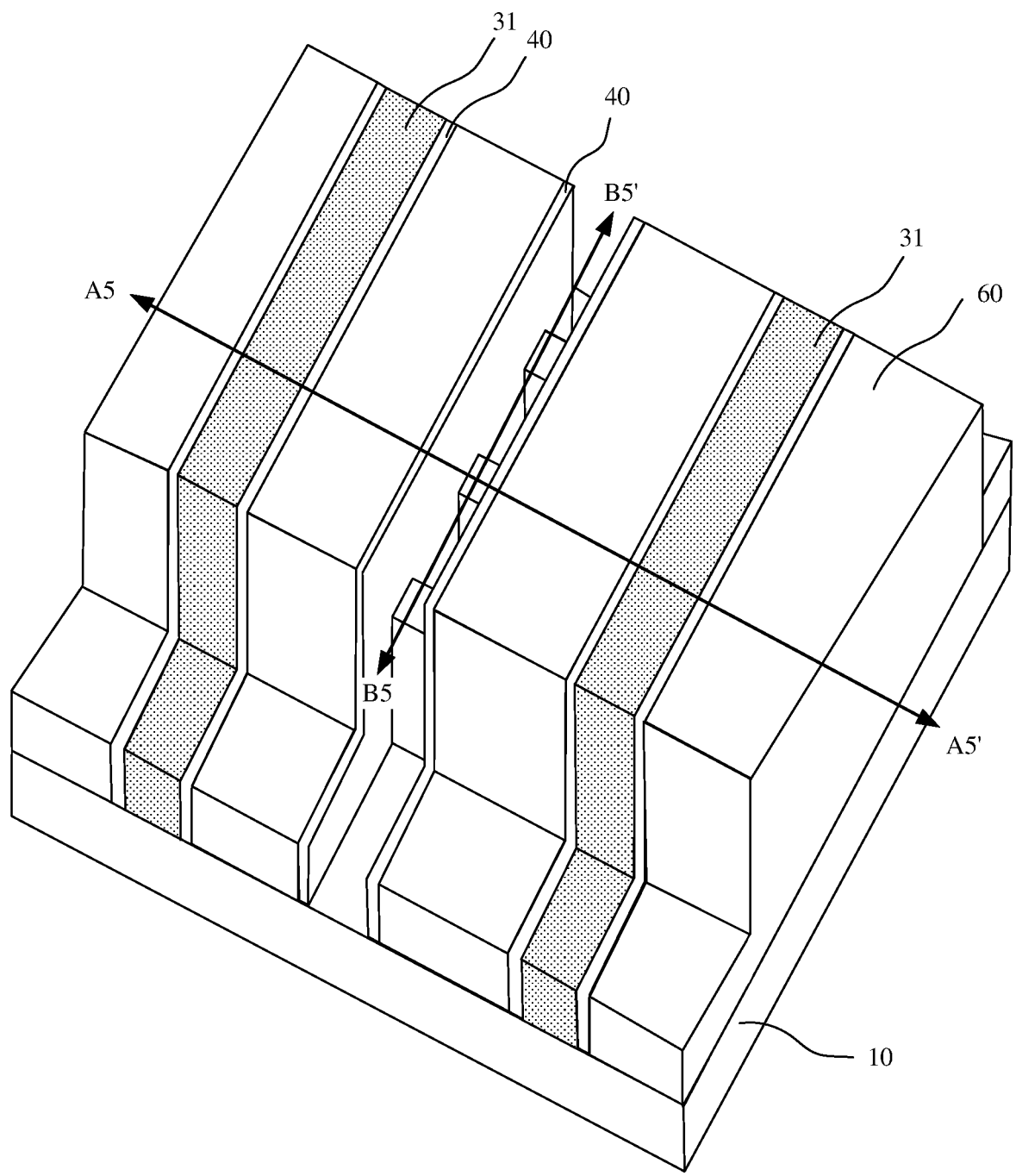
Figure 9B:
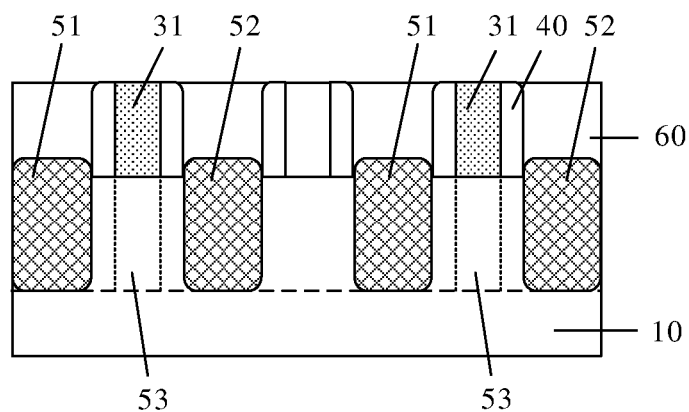
Figure 9C:
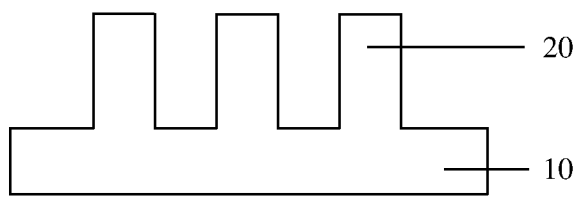

S25. As shown in FIG. 9a, FIG. 9b, and FIG. 9c, remove the second dummy gate 32.

Figure 9D:
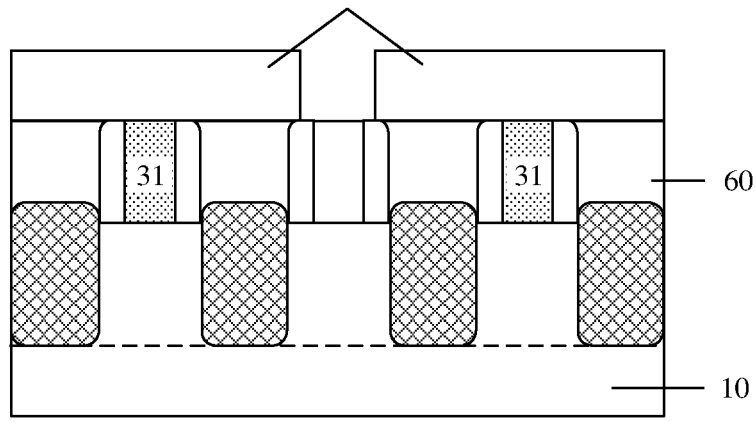
FIG. 9d is a schematic diagram of forming, above an inter-layer insulating layer, a first photosensitive layer with an exposed second dummy gate before the second dummy gate is removed.

To avoid a case in which the first dummy gates 31 are removed when the second dummy gate 32 is removed, after step S24 and before S25, as shown in FIG. 9d, a first photosensitive layer 81 is formed by using a photolithography process, and the second dummy gate 32 is exposed from the first photosensitive layer 81, so that the first photosensitive layer 81 protects the first dummy gates 31. A material of the first photosensitive layer 81 may be, for example, photoresist.

When the second dummy gate 32 is removed, the first dummy gates 31 are reserved to protect the channel region 53.

On this basis, the second dummy gate 32 may be removed by using a wet etching process or a dry etching process. After the second dummy gate 32 is removed, a region that is of the fin 20 and that is covered by the second dummy gate 32 is exposed. A projection, on the substrate 10, of the part that is of the fin 20 and that is exposed after the second dummy gate 32 is removed overlaps a projection of the second dummy gate 32 on the substrate 10.

Figure 10C:
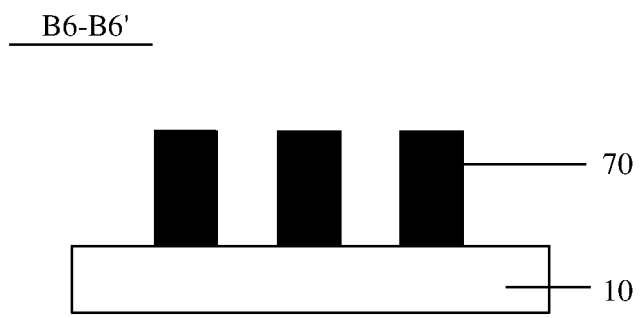
Figure 11A:
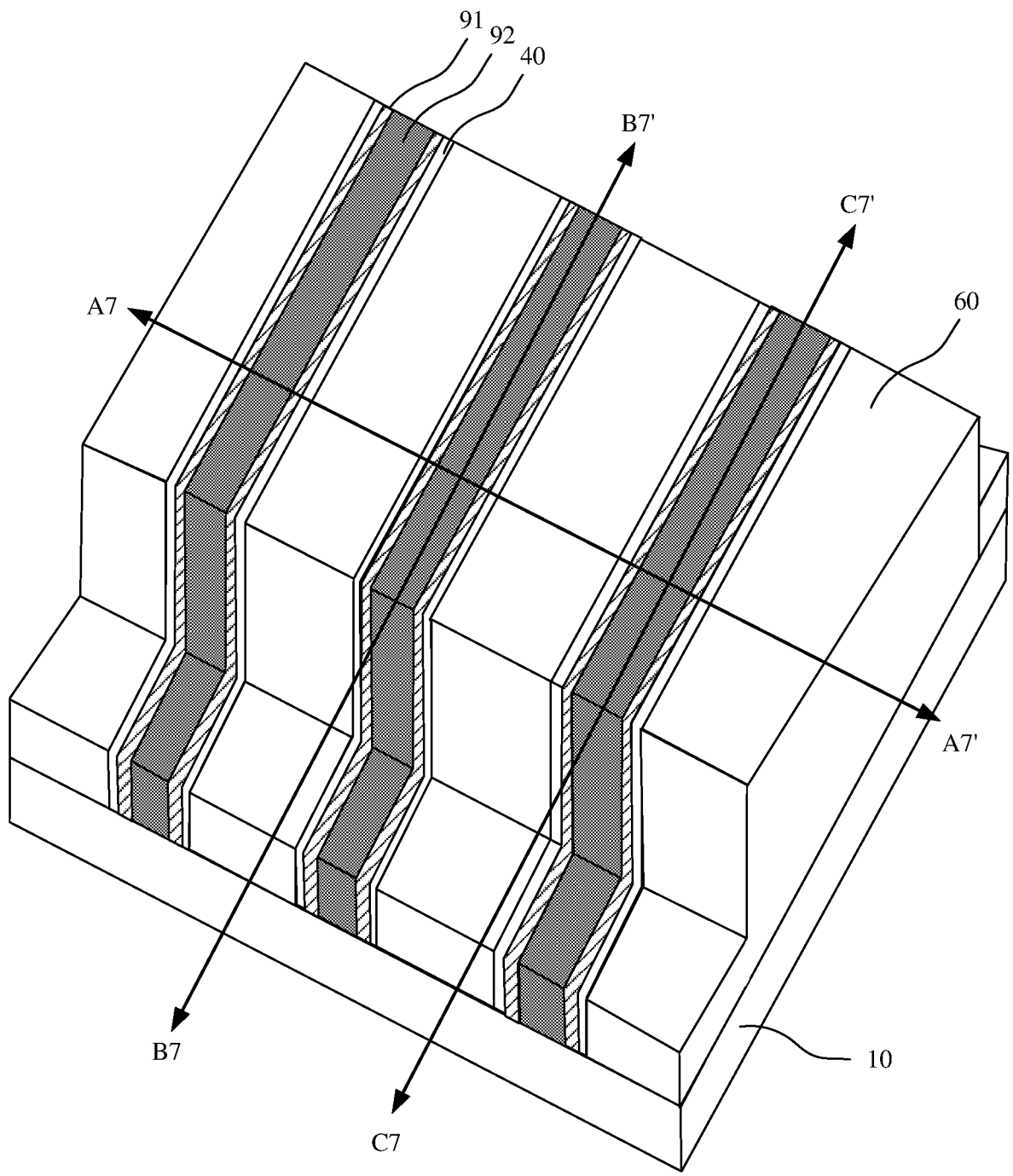
Figure 11B:
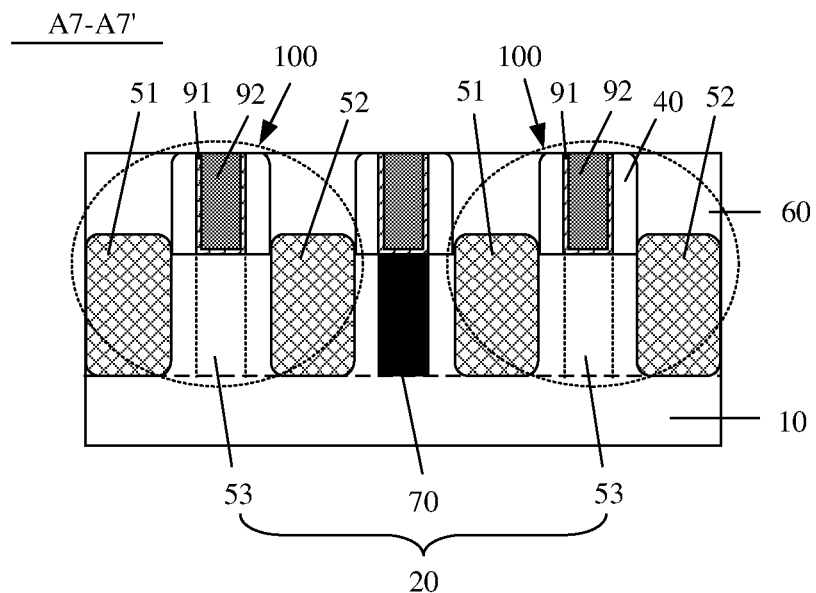
Figure 11C:
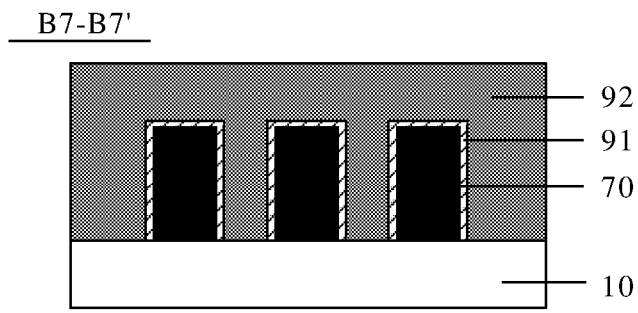
Figure 11D:
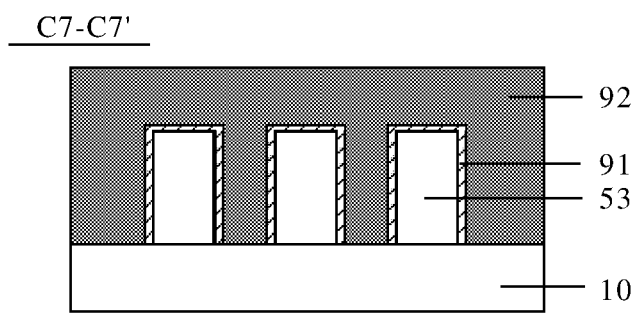

S26. As shown in FIG. 10a, FIG. 10b, and FIG. 10c, process the part that is of the fin 20 and that is exposed after the second dummy gate 32 is removed, to form the isolation section 70 and further suppress current transfer in the part that is of the fin 20 and that is exposed after the second dummy gate 32 is removed.

The part that is of the fin 20 and that is exposed after the second dummy gate 32 is removed is processed, to change electrical conductivity of the part that is of the fin 20 and that is exposed after the second dummy gate 32 is removed, so that the electrical conductivity of the part is reduced or the part is completely insulated. After the isolation section 70 is formed, the isolation section 70 may implement suppression of the leakage current path between two transistors adjacent to the isolation section 70.

After the second dummy gate 32 is removed from the fin 20, a semiconductor layer on the exposed part is processed, to form the isolation section and further suppress the current transfer in the part that is of the fin 20 and that is exposed after the second dummy gate 32 is removed. The following two manners may be used.

Manner 1: Dope, with inert atoms by using one process of plasma trimming, plasma doping, or ion doping, a part that is of the first semiconductor layer 231 and that is exposed after the second dummy gate 32 is removed, to change electrical conductivity of the part that is of the first semiconductor 231 and that is exposed after the second dummy gate 32 is removed and further form the isolation section 70.

For example, at least one of H, O, N, Si, C, or the like may be doped into the first semiconductor layer 231 that is exposed after the second dummy gate 32 is removed, to change the electrical conductivity of the first semiconductor layer 231 that is exposed after the second dummy gate 32 is removed and further form the isolation section 70.

For the part that is of the first semiconductor layer 231 and that is exposed after the second dummy gate 32 is removed, all the first semiconductor layer 231 that is exposed after the second dummy gate 32 is removed may be processed, or a part of a region that is of the first semiconductor layer 231 and that is exposed after the second dummy gate 32 is removed may be processed, provided that the leakage current path can be suppressed.

Manner 2: Process, by using an etching process, the part that is of the first semiconductor layer 231 and that is exposed after the second dummy gate 32 is removed, to change a shape of the exposed part of the first semiconductor layer 231, thereby changing the electrical conductivity of the first semiconductor layer 231 that is exposed after the second dummy gate 32 is removed and further forming the isolation section 70.

The etching process includes at least one of dry etching, wet etching, or atomic layer etching.

The shape change of the part that is of the first semiconductor layer 231 and that is exposed after the second dummy gate 32 is removed may be reduction of a thickness t of at least a part of the exposed first semiconductor layer 231. For example, the part that is of the first semiconductor layer 231 and that is exposed after the second dummy gate 32 is removed is processed by using the etching process, to reduce the thickness t of the exposed part of the first semiconductor layer 231 in a direction perpendicular to the gate length direction X or a thickness direction of the substrate 10. A reduction amplitude depends on a required isolation effect that can be provided based on a current new process. For example, a reduction of 30% to 70% may be implemented based on a thickness of the semiconductor layer or relative to a thickness of a channel. For example, original 5 nm to 7 nm is reduced to 2 nm to 3 nm.

When the manner of reducing the thickness t of the part that is of the first semiconductor layer 231 and that is exposed after the second dummy gate 32 is removed is used, a threshold voltage of the first semiconductor layer 231 whose thickness t is reduced is increased, so that a leakage current is greatly reduced, thereby suppressing the leakage current path.

Alternatively, the fin 20 that is exposed after the second dummy gate 32 is removed may be processed by using an etching process, to change the shape of the exposed part of the first semiconductor layer 231.

When the manner of changing the shape of the part that is of the first semiconductor layer 231 and that is exposed after the second dummy gate 32 is removed is used, for example, the shape of the exposed first semiconductor layer 231 may be etched to be in a dumbbell shape, or the exposed first semiconductor layer 231 may be broken in the gate length direction X, to block the drain current path, thereby suppressing the drain current path.

Alternatively, the shape may be changed in another manner. Provided that the leakage current path can be suppressed based on the shape change, the shape falls within the protection scope of this application.

Based on the foregoing steps S20 to S26, the second dummy gate 32 may be removed by using a simple process, and the first semiconductor layer 231 that is exposed after the second dummy gate 32 is removed is processed to form the isolation section 70 for suppressing the leakage current path between the two adjacent FinFETs.

After step S26, a real gate may be formed by using a replacement metal gate (RMG) process.

On this basis, the preparation method of the integrated circuit device further includes the following step.

S27. As shown in FIG. 11*a*, FIG. 11*b*, FIG. 11*c*, and FIG. 11*d*, remove the first dummy gates 31, and separately form a gate dielectric layer 91 and a gate 92 at a location at which each of the second dummy gate 32 and the first dummy gates 31 is removed.

Optionally, the gate dielectric layer 91 and the gate 92 are prepared by using a high k dielectric layer and a metal gate (High-k metal gate, HKMG).

It should be noted that, after step S24 and before step S25, the first photosensitive layer 81 is formed. Therefore, before the first dummy gate 31 is removed in step S27, the first photosensitive layer 81 should be removed.

In addition, although the gate dielectric layer 91 and the gate 92 are also formed above the isolation section 70, the gate 92 does not have a normal channel enabling feature.

Therefore, after step S27, one FinFET is formed on each side of the region in which the isolation section 70 is located. Each fin field-effect transistor includes a source 51, a drain 52, a channel region 53, a gate dielectric layer 91, and a gate 92.

On this basis, a contact structure may be subsequently formed above the source 51, the drain 52, and the gate 92 of the transistor (that is, a side that is distant from the substrate 10 and that is of the source 51, the drain 52, and the gate 92 of the transistor). In addition, interconnection between the transistors may also be implemented by using a metal connection-line layer and a metal through-hole layer.

For example, the integrated circuit device includes a stacked gate-all-around nanosheet transistor. An embodiment of this application further provides another preparation method of an integrated circuit device. As shown in FIG. 12, the method includes the following steps.

S30. As shown in FIG. 13*a*, FIG. 13*b*, FIG. 13*c*, and FIG. 13*d*, form, on a substrate 10, a fin 20 protruding from the substrate 10, where the fin 20 includes a plurality of first semiconductor layers 231 and a plurality of second semiconductor layers 232, the first semiconductor layers 231 and the second semiconductor layers 232 are alternately disposed in a thickness direction of the substrate 10, a direction of a thickness t of the fin 20 is perpendicular to a gate length direction X and the thickness direction of the substrate 10.

Herein, "plurality of" in the plurality of first semiconductor layers 231 and the plurality of second semiconductor layers 232 indicates at least two layers. A specific quantity of layers may be properly set as required. Whether a first formed layer is the first semiconductor layer 231 or the second semiconductor layer 232, and whether a last formed layer is the first semiconductor layer 231 or the second semiconductor layer 232 are not limited in this embodiment of this application. The first semiconductor layer 231 and the second semiconductor layer 232 are made of different materials.

Optionally, the fin 20 is formed on an upper surface of the substrate 10 by using an epitaxy process.

On this basis, a manner of forming the fin 20 is: epitaxially growing the plurality of first semiconductor layers 231 and the plurality of second semiconductor layers 232 on the upper surface of the substrate 10, where the first semiconductor layers 231 and the second semiconductor layers 232 are alternately formed in the thickness direction of the substrate 10; then, etching the first semiconductor layers 231 and the second semiconductor layers 232 until the upper surface of the substrate 10 is exposed; forming a trench in the first semiconductor layers 231 and the second semiconductor layers 232; and forming the fin 20 by using a protruding part between adjacent trenches.

Another manner of forming the fin 20 is: forming an isolation layer on the upper surface of the substrate 10; etching the isolation layer until the upper surface of the substrate 10 is exposed; and forming a trench in the isolation layer. On this basis, the plurality of first semiconductor layers 231 and the plurality of second semiconductor layers 232 are epitaxially grown in the trench, and the plurality of first semiconductor layers 231 and the plurality of second semiconductor layers 232 are alternately formed in the thickness direction of the substrate 10, thereby forming the fin 20 in the trench. Then, the isolation layer is etched, so that a surface of the isolation layer is lower than a top surface of the fin 20.

A material of the substrate 10 may be one of bulk silicon, silicon germanium, silicon carbide, SOI, or GOI. A material of the fin 20 may be one of silicon, silicon germanium, germanium, or silicon carbide.

S31. As shown in FIG. 13*a*, FIG. 13*b*, FIG. 13*c*, and FIG. 13*d*, form at least two first dummy gates 31 and at least one second dummy gate 32, where the at least two first dummy gates 31 and the at least one second dummy gate 32 are arranged in the gate length direction X, each second dummy gate 32 is located between two adjacent first dummy gates 31, and the first dummy gates 31 and the second dummy gate 32 all are in contact with two opposite side surfaces and the top surface of the fin 20.

The first dummy gate 31 is used to occupy space and locations for a subsequently formed real gate and gate dielectric layer. Therefore, the first dummy gate 31 needs to be subsequently removed. For the second dummy gate 32, a main purpose of the second dummy gate 32 is to form an isolation section 70 in a subsequent process. Therefore, a size of the second dummy gate 32 may be determined based on a size of the isolation section 70.

The first dummy gates 31 and the second dummy gate 32 are made of the same material. The material of the first dummy gates 31 and the second dummy gate 32 may be at least one of polycrystalline silicon, amorphous silicon, or amorphous carbon.

The first dummy gates 31 and the second dummy gate 32 may be simultaneously prepared by using photolithography and etching processes.

Figure 14B:
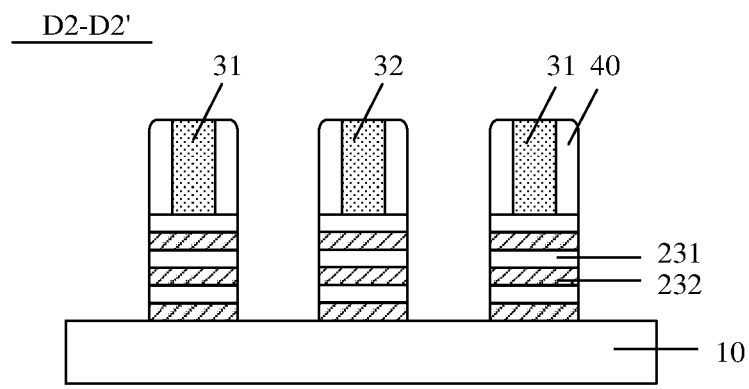

S32. As shown in FIG. 14*a* and FIG. 14*b*, form side walls 40 on two sides of each of the second dummy gate 32 and the first dummy gates 31 in the gate length direction X.

The side walls 40 have a function of protecting the first dummy gates 31 and the second dummy gate 32. In addition, in a subsequent process of forming a source and a drain, a source and a drain are respectively formed on the two sides of the first dummy gate 31 in a self-aligned manner of the first dummy gates 31 and the second dummy gate 32.

Figure 14C:
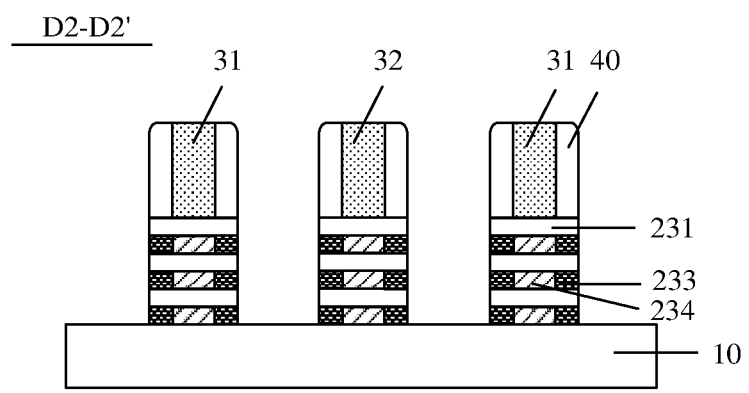
FIG. 14c is a schematic diagram of forming inner walls and a sacrificial layer based on FIG. 14b.

S33. As shown in FIG. 14*a* and FIG. 14*b*, remove the fin 20 that is not covered by the first dummy gates 31, the side walls 40 on the two sides of each of the first dummy gates 31, the second dummy gate 32, and the side walls 40 on the two sides of the second dummy gate 32; in addition, as shown in FIG. 14*c*, process a region that is of the second semiconductor layer 232 of the reserved fin 20 and that is not covered by the side walls 40 to form inner walls 233; and use a remaining region that is of the second semiconductor layer 232 and that is not covered by the side walls 40 as a sacrificial layer 234.

Optionally, the region that is of the second semiconductor layer 232 of the reserved fin 20 and that is covered by the side walls 40 is processed by using a selective oxidization (selectively oxidization) process, so that the region that is of the second semiconductor layer 232 of the reserved fin 20 and that is covered by the side walls 40 is oxidized. In this way, the inner walls 233 are formed in the oxidized region. The region that is of the reserved second semiconductor layer 232 and that is covered by the side walls 40 is a region that is of the reserved second semiconductor layer 232 and that is not covered by the first dummy gates 31 and the second dummy gate 32.

Figure 15A:
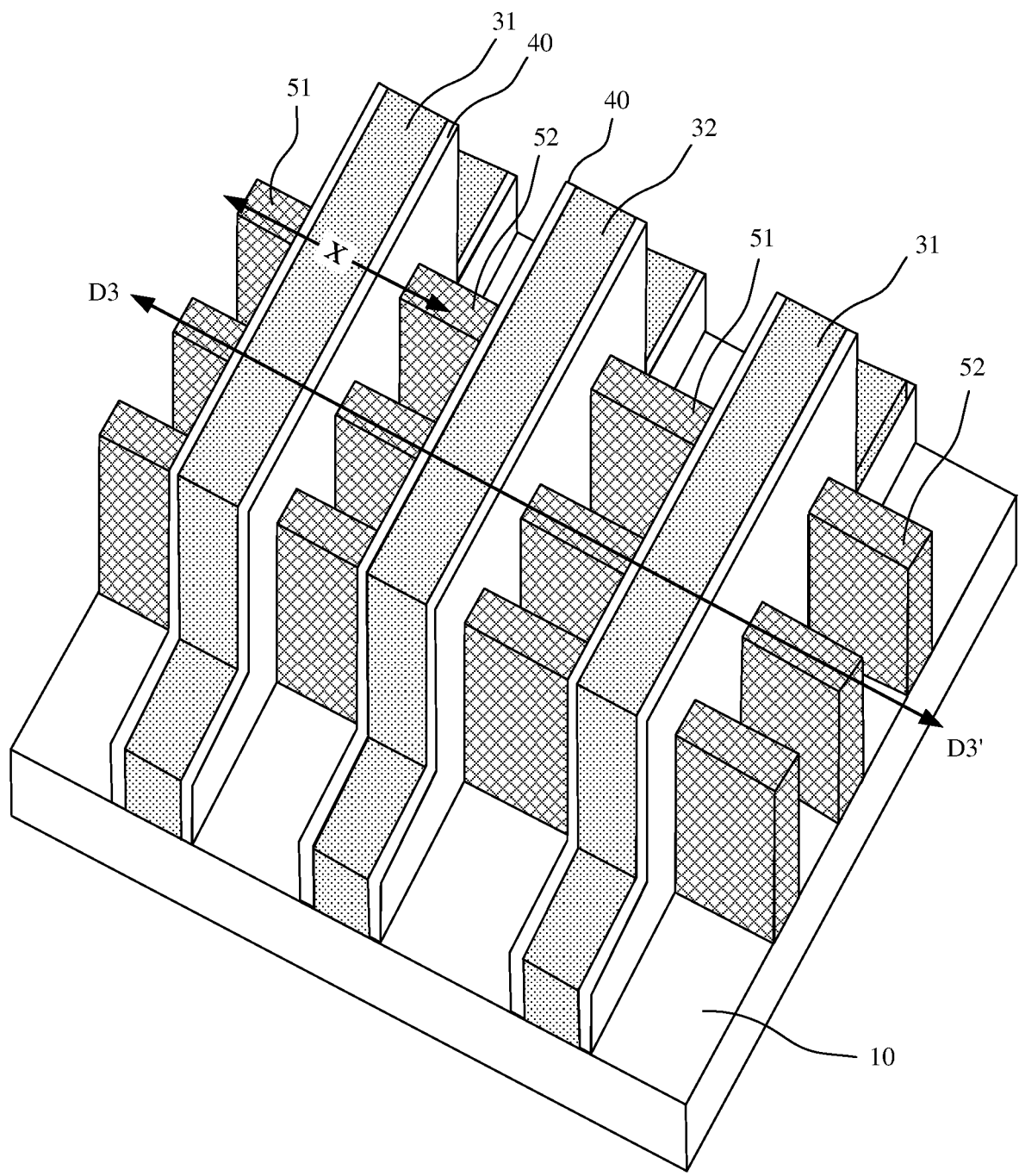
Figure 15B:
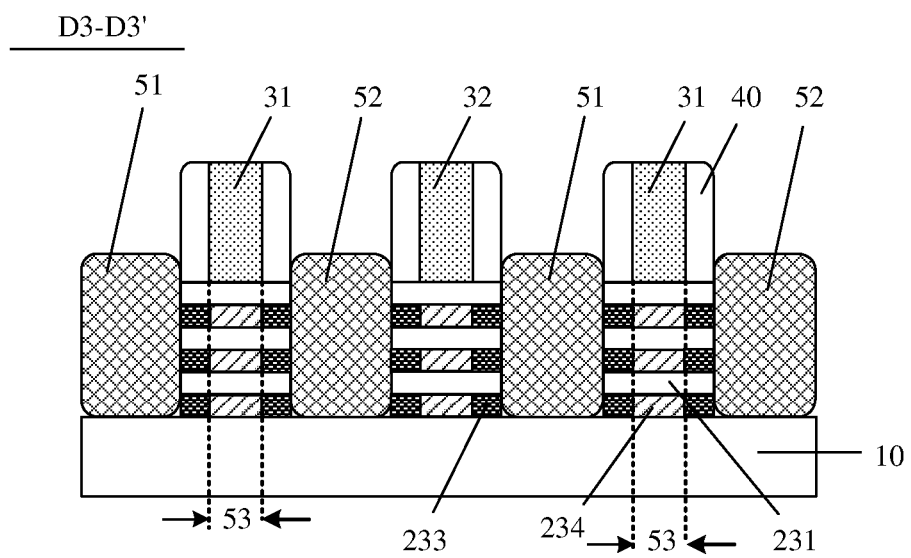

S34. As shown in FIG. 15a and FIG. 15b, respectively form a source 51 and a drain 52 on the two sides of each first dummy gate 31 in the gate length direction X.

A person skilled in the art understands that the source 51 and the drain 52 are formed in a region that is not covered by the first dummy gates 31, the side walls 40 on the two sides of each of the first dummy gates 31, the second dummy gate 32, and the side walls on the two sides of the second dummy gate 32.

For the first dummy gate 31 on one side of the second dummy gate 32, when the source 51 and the drain 52 are respectively formed on the two sides of the first dummy gate 31 in the gate length direction X, one of the source 51 or the drain 52 is located between the first dummy gate 31 and the second dummy gate 32. Similarly, for the first dummy gate 31 on the other side of the second dummy gate 32, when the source 51 and the drain 52 are respectively formed on the two sides of the first dummy gate 31 in the gate length direction X, one of the source 51 or the drain 52 is located between the first dummy gate 31 and the second dummy gate 32.

It can be learned that, as shown in FIG. 15b, a region that is of the fin 20 and that is covered by the first dummy gate 31 becomes a channel region 53. A projection of the channel region 53 on the substrate 10 overlaps a projection of the first dummy gate 31 on the substrate 10.

After step S34, the source 51, the drain 52, and the channel region 53 of a stacked gate-all-around nanosheet transistor have been formed on one side of the second dummy gate 32 in the gate length direction X. Similarly, the source 51, the drain 52, and the channel region 53 of another stacked gate-all-around nanosheet transistor have been formed on the other side of the second dummy gate 32 in the gate length direction X.

When an N-type stacked gate-all-around nanosheet transistor is formed, SiGe containing B may be epitaxially grown on the two sides of the first dummy gate 31 in the gate length direction X by using a selective epitaxy process, to form the source 51 and the drain 52. When a P-type stacked gate-all-around nanosheet transistor is formed, Si containing P may be epitaxially grown on the two sides of the first dummy gate 31 in the gate length direction X by using a selective epitaxy process, to form the source 51 and the drain 52.

It should be noted that FIG. 15a is a schematic diagram of separately forming a plurality of sources 51 and a plurality of drains 52 on the two sides of the first dummy gates 31 in the gate length direction X ("a plurality of" herein may be consistent with a quantity of fins 20). However, this application is not limited thereto. Alternatively, a plurality of sources 51 on one side of the first dummy gates 31 in the gate length direction X may be combined into one source 51, and a plurality of drains 52 on the other side of the first dummy gates 31 in the gate length direction X may be combined into one drain 52.

Figure 16B:
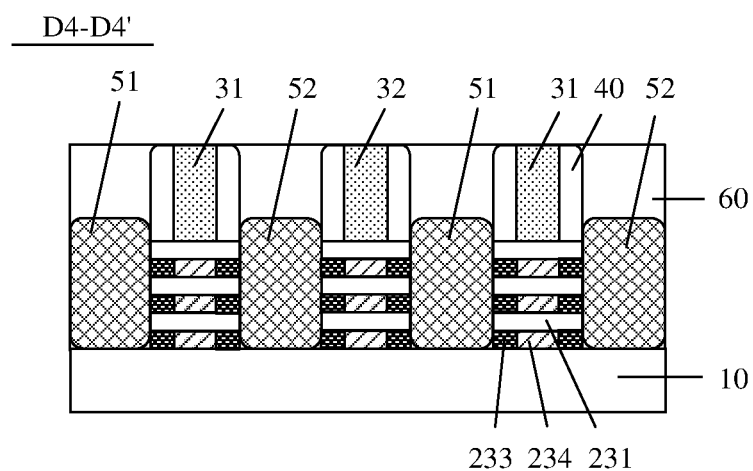

S35. As shown in FIG. 16a and FIG. 16b, form an inter-layer insulating layer 60. An upper surface of the inter-layer insulating layer 60 is aligned with upper surfaces of the second dummy gate 32 and the first dummy gates 31.

Optionally, an insulating material may be deposited. For example, the insulating material may be silicon oxide or silicon nitride. The upper surface of the inter-layer insulating layer 60 is aligned with the upper surfaces of the second dummy gate 32 and the first dummy gates 31 by using a CMP process, to expose the first dummy gates 31 and the second dummy gate 32.

The upper surface of the inter-layer insulating layer 60 is aligned with the upper surfaces of the second dummy gate 32 and the first dummy gates 31. In other words, the upper surfaces of the second dummy gate 32, the side walls 40 on the two sides of the second dummy gate 32, the first dummy gates 31, and the side walls 40 on the two sides of each of the first dummy gates 31 are exposed.

S36. As shown in FIG. 17a, FIG. 17b, FIG. 17c, and FIG. 17d, remove the first dummy gates 31, the second dummy gate 32, and the sacrificial layer 234.

Because the first semiconductor layer 231 and the second semiconductor layer 232 are made of different materials, herein, the sacrificial layer 234 may be removed by using a flowing etching liquid based on a wet removal process.

Figure 18A:
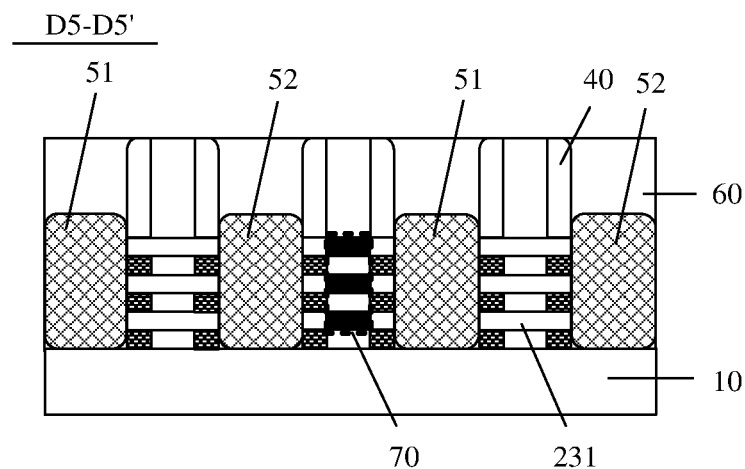
FIG. 18a is a schematic sectional view in a D5D5' direction after an isolation section is formed based on FIG. 17b.
Figure 18B:
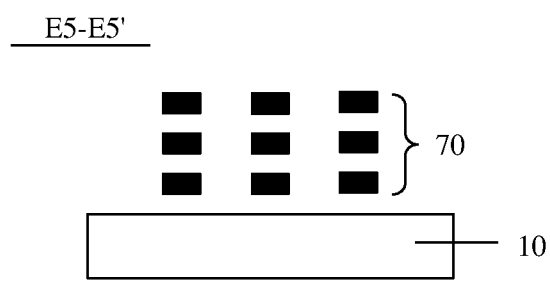
FIG. 18b is a schematic sectional view in an E5E5' direction after an isolation section is formed based on FIG. 17c.
Figure 18C:
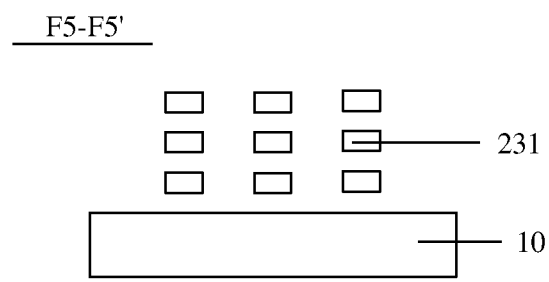
FIG. 18c is a schematic sectional view in an F5F5' direction after an isolation section is formed based on FIG. 17d.
Figure 19A:
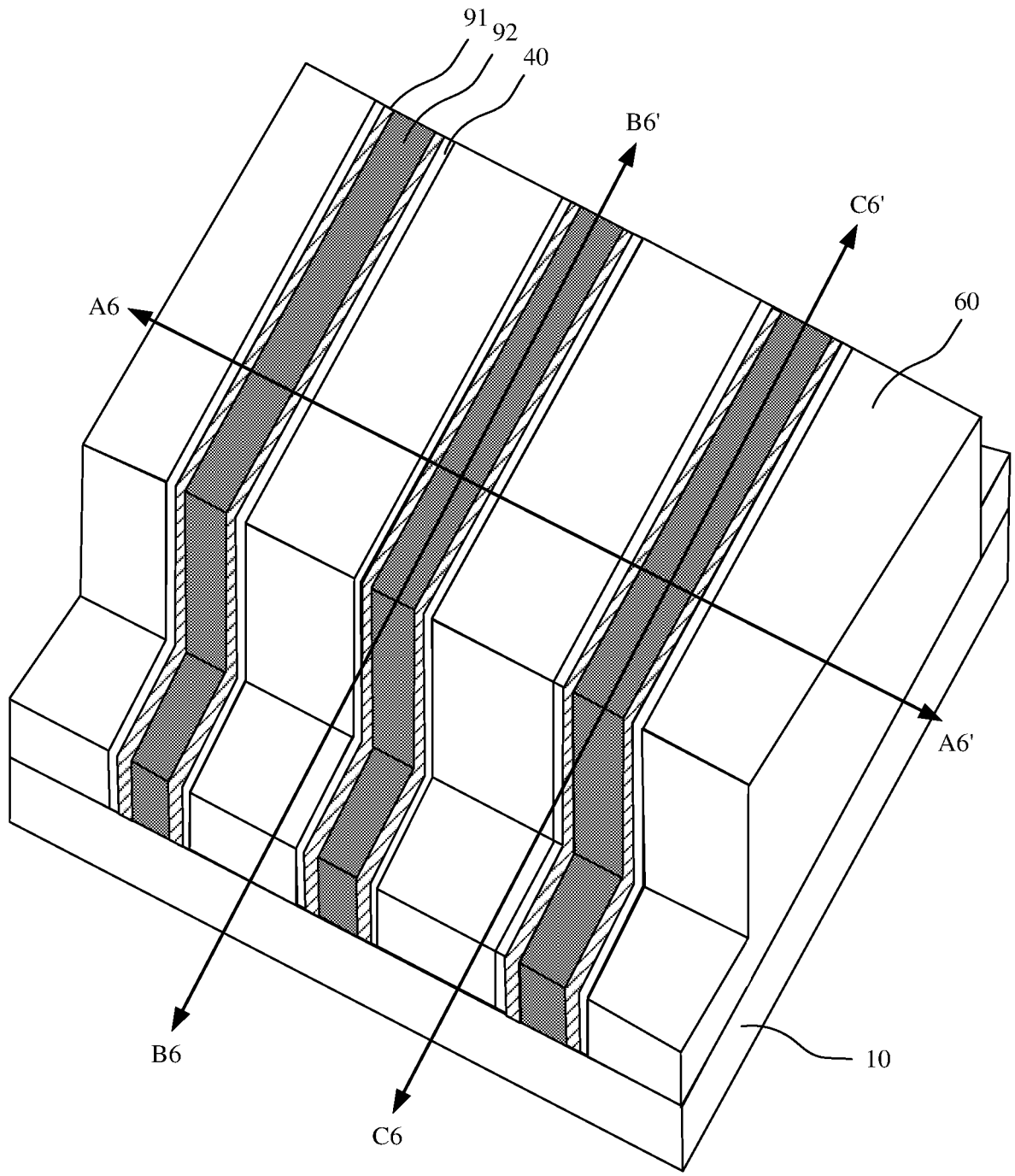
Figure 19B:
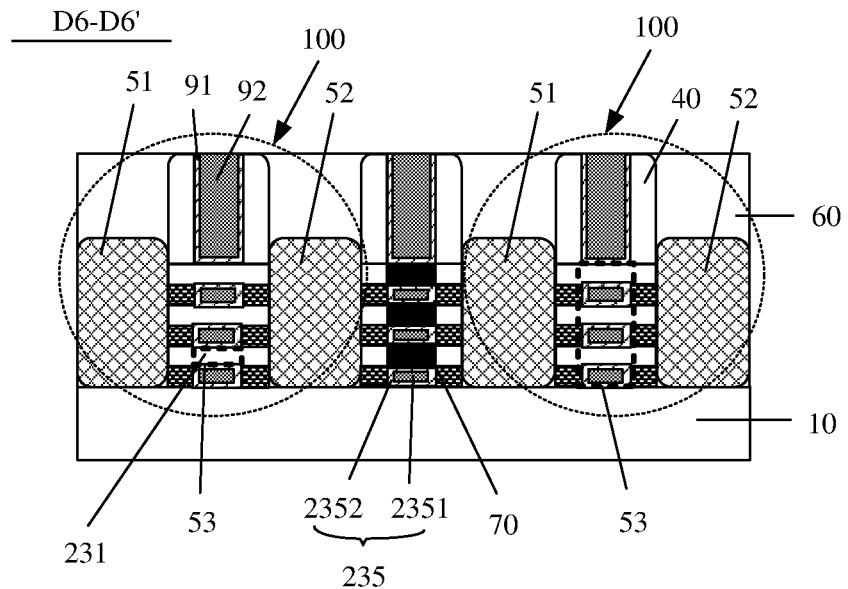
Figure 19C:
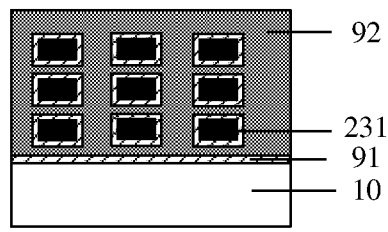
Figure 19D:
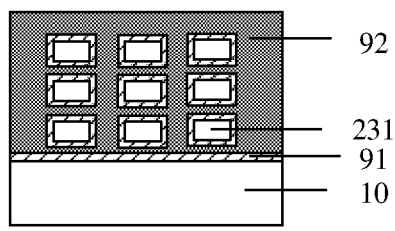

S37. As shown in FIG. 18a, FIG. 18b, and FIG. 18c, process the part that is of the fin 20 and that is exposed after the second dummy gate 32 is removed, to form the isolation section and further suppress current transfer in the part that is of the fin 20 and that is exposed after the second dummy gate 32 is removed.

Because the sacrificial layer 234 has been removed in step S36, actually, only the first semiconductor layer 231 exists in the part that is of the fin 20 and that is exposed after the second dummy gate 32 is removed. Therefore, processing the part that is of the fin 20 and that is exposed after the second dummy gate 32 is removed is actually processing the part that is of the first semiconductor layer 231 of the fin 20 and that is exposed after the second dummy gate 32 is removed.

Figure 17A:
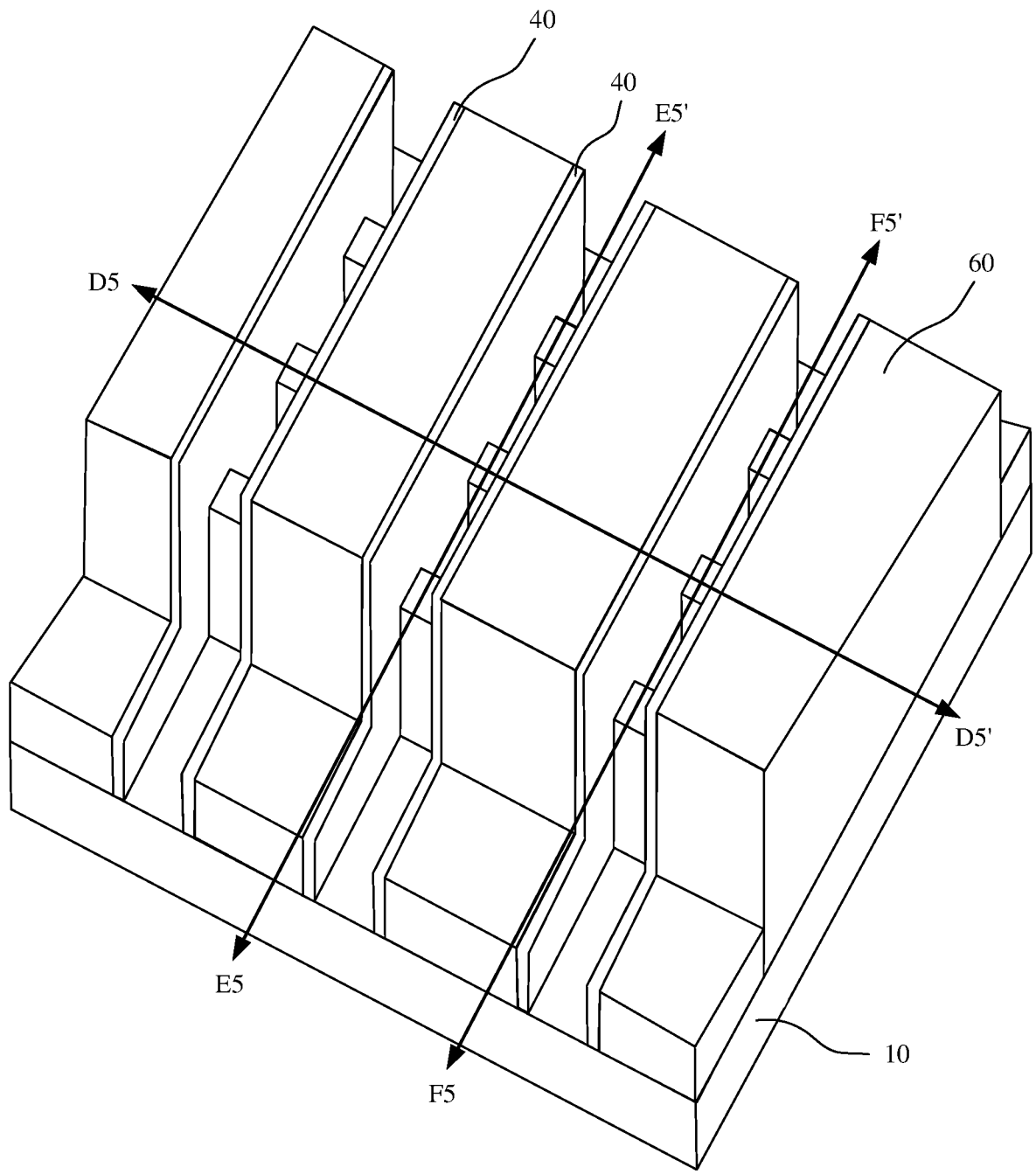
Figure 17B:
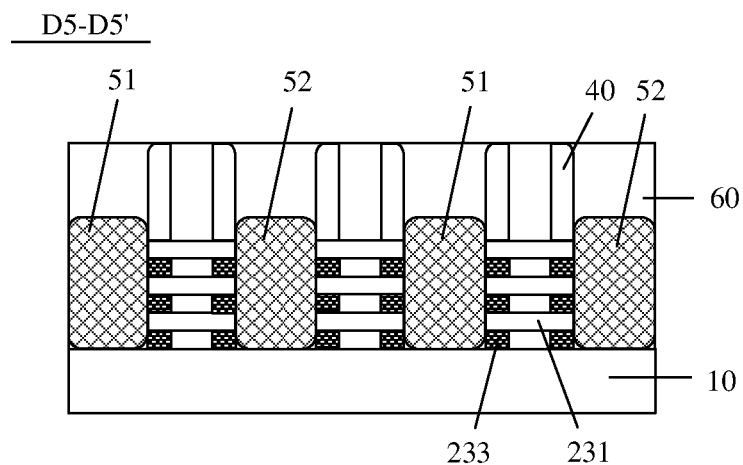
Figure 17C:
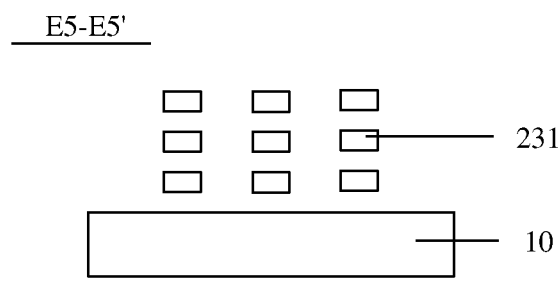
Figure 17D:
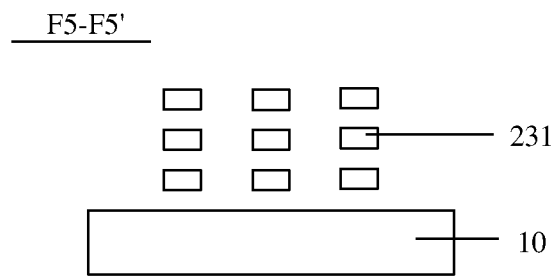
Figure 17E:
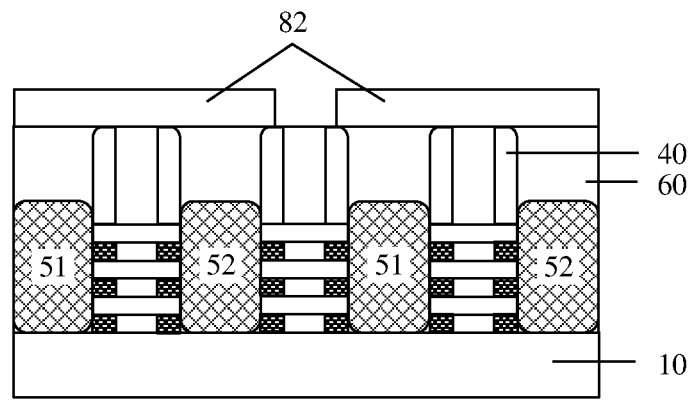
FIG. 17e is a schematic diagram of forming a second photosensitive layer with a region exposed after a second dummy gate is removed, before a first semiconductor layer that is of a fin and that is exposed after the second dummy gate is removed is processed.

When the part that is of the first semiconductor layer 231 of the fin 20 and that is exposed after the second dummy gate 32 is removed, to avoid an impact on the channel region 53 that is exposed after the first dummy gate 31 is removed, after step S36 and before step S37, as shown in FIG. 17e, a second photosensitive layer 82 is formed by using a photolithography process, and a region of the second photosensitive layer 82 is exposed after the second dummy gate 32 is removed. In this way, the first photosensitive layer 81 may protect the region obtained after the first dummy gate 31 is removed.

A person skilled in the art understands that the part that is of the first semiconductor layer 231 of the fin 20 and that is exposed after the second dummy gate 32 is removed may be processed, to change electrical conductivity of the first semiconductor layer 231, so that the electrical conductivity of the first semiconductor layer 231 is reduced or the first semiconductor layer 231 is completely insulated. After the isolation section 70 is formed, the isolation section 70 may implement suppression of the leakage current path between two transistors adjacent to the isolation section 70.

Optionally, the part that is of the first semiconductor layer 231 of the fin 20 and that is exposed after the second dummy gate 32 is removed may be processed in the following two manners:

Manner 1: Dope, with inert atoms by using one process of plasma trimming, plasma doping, or ion doping, the part that is of the first semiconductor layer 231 of the fin 20 and that is exposed after the second dummy gate 32 is removed, to insulate the exposed part of the first semiconductor layer 231.

For example, H, O, N, Si, C, or the like may be doped into the first semiconductor layer 231 that is of the fin 20 and that is exposed after the second dummy gate 32 is removed, to change electrical conductivity of the part that is of the first semiconductor layer 231 of the fin 20 and that is exposed after the second dummy gate 32 is removed.

For the part that is of the first semiconductor layer 231 of the fin 20 and that is exposed after the second dummy gate 32 is removed, all the part that is of the first semiconductor layer 231 of the fin 20 and that is exposed after the second dummy gate 32 is removed may be processed, or a part of a region that is of the first semiconductor layer 231 of the fin 20 and that is exposed after the second dummy gate 32 is removed may be processed, provided that the leakage current path can be suppressed.

Manner 2: Process, by using an etching process, the part that is of the first semiconductor layer 231 of the fin 20 and that is exposed after the second dummy gate 32 is removed, to change a shape of the part that is of the first semiconductor layer 231 of the fin 20 and that is exposed after the second dummy gate 32 is removed, thereby changing electrical conductivity of the part that is of the first semiconductor layer 231 of the fin 20 and that is exposed after the second dummy gate 32 is removed.

The etching process includes at least one of dry etching, wet etching, or atomic layer etching.

Changing the shape of the part that is of the first semiconductor layer 231 of the fin 20 and that is exposed after the second dummy gate 32 is removed may be reducing, in a direction perpendicular to the gate length direction X or the thickness direction of the substrate 10, a thickness of at least a part of the part that is of the first semiconductor layer 231 of the fin 20 and that is exposed after the second dummy gate 32 is removed; or may be changing the shape of the part that is of the first semiconductor layer 231 of the fin 20 and that is exposed after the second dummy gate 32 is removed. Alternatively, the shape may be changed in another manner, provided that the leakage current path can be suppressed based on the shape change. This all falls within the protection scope of this application.

When the manner of reducing the thickness of the part that is of the first semiconductor layer 231 of the fin 20 and that is exposed after the second dummy gate 32 is removed is used, a threshold voltage of the first semiconductor layer 231 of the thinned fin 20 is increased, so that a leakage current is greatly reduced, thereby suppressing the leakage current path.

When the manner of changing the shape of the part that is of the first semiconductor layer 231 of the fin 20 and that is exposed after the second dummy gate 32 is removed is used, for example, the shape of the part that is the first semiconductor layer 231 of the fin 20 and that is exposed after the second dummy gate 32 is removed may be etched to obtain a dumbbell shape, or the exposed part that is of first semiconductor layer 231 of the fin 20 and that is exposed after the second dummy gate 32 is removed may be broken in the gate length direction X, to block the drain current path, thereby suppressing the drain current path.

Based on the foregoing steps S30 to S37, the part that is of the first semiconductor layer 231 of the fin 20 and that is exposed after the second dummy gate 32 is removed is processed by using a simple process, to suppress a leakage current path between two adjacent transistors.

After step S37, a real gate may be formed by using an RMG process.

On this basis, the preparation method of the integrated circuit device further includes the following steps.

S38. As shown in FIG. 19a, FIG. 19b, FIG. 19c, and FIG. 19d, form a gate dielectric layer 91 and a gate 92 at a location at which each of the second dummy gate 32 and the first dummy gates 31 is removed; form, at a location of the sacrificial layer 234, a gate material layer 2351 and a gate dielectric material layer 2352 that is wrapped outside the gate material layer 2351; and use the gate material layer 2351 and the gate dielectric material layer 2352 as an auxiliary layer 235.

The gate material layer 2351 and the gate dielectric material layer 2352 in the auxiliary layer 235 may be formed by using, for example, an ALD (Atomic Layer Deposition) process.

Optionally, the gate dielectric layer 91 and the gate 92 are prepared by using a high k dielectric layer and a metal gate (High-k metal gate, HKMG).

It should be noted that before the first semiconductor layer 231 is processed, the second photosensitive layer 82 that is used to protect a region in which the first dummy gate 31 is removed is formed. Therefore, before the gate dielectric layer 91 and the gate 92 are formed, the second photosensitive layer 82 should be removed.

In addition, although the gate dielectric layer 91 and the gate 92 are also formed above the isolation section 70, the gate 92 does not have a normal channel enabling feature.

Therefore, after step S38, one stacked gate-all-around nanosheet transistor is formed on each side of the region in which the isolation section 70 is located. Each stacked gate-all-around nanosheet transistor includes a source 51, a drain 52, a channel region 53, a gate dielectric layer 91, and a gate 92.

On this basis, a contact structure may be subsequently formed above the source 51, the drain 52, and the gate 92 of the transistor (that is, a side that is distant from the substrate 10 and that is of the source 51, the drain 52, and the gate 92 of the transistor). In addition, interconnection between the transistors may also be implemented by using a metal connection-line layer and a metal through-hole layer.

An embodiment of this application further provides an integrated circuit device. As shown in FIG. 11a to FIG. 11d or FIG. 19a to FIG. 19d, the integrated circuit device includes a substrate 10 and a fin 20 protruding from the substrate 10. The integrated circuit device further includes two adjacent transistors 100. The two adjacent transistors 100 use two spaced segments on the fin 20 as respective channels 53 of the two adjacent transistors 100. A part that is of the fin 20 and that is located between the two spaced segments is processed to obtain an isolation section 70. The isolation section 70 is used to suppress current transfer between the two channels 53 of the two adjacent transistors 100.

A person skilled in the art should understand that a part of the fin 20 is used as the channel 53 of the transistor 100. Therefore, the fin 20 necessarily includes a film structure made of a semiconductor material. The fin 20 may be a semiconductor layer, or may be a stacked structure that includes alternately disposed layers. Some of the layers are semiconductor layers.

FIG. 11a to FIG. 11d and FIG. 19a to FIG. 19d show merely an example in which three fins 20 are included on the substrate 10, the three fins 20 are in a group, and two transistors 100 share one fin 20. A plurality of groups of fins 20 may be disposed as required. A quantity of fins 20 included in each group is not limited. A plurality of transistors 100 may share one fin 20. An isolation section 70 is disposed between channels 53 of any adjacent transistors 100 sharing the same fin 20.

Herein, the isolation section 70 is used to suppress current transfer between the two channels 53 of two transistors 100. The isolation section 70 may include a broken region, to block the current transfer between the two channels 53 of the two transistors 100. Alternatively, a special structure of the isolation section 70 may disable the current transfer between the two channels 53 of the two transistors 100 in the isolation section 70.

The integrated circuit device may be a microprocessor, a memory, a logical component, or another component including an integrated circuit.

For the integrated circuit device provided in this embodiment of this application, the part that is of the fin 20 and that is located between the two spaced segments is processed by using a simple process, to suppress the current transfer between the two channels 53 of the two transistors 100. In this way, structures and stress of the transistors 100 on two sides of the isolation section 70 are lightly affected, an introduced variation of a device feature parameter is minimum, an area resource occupied by the isolation section 70 is relatively small, and a special winding resource does not need to be designed.

In some embodiments, as shown in FIG. 11a to FIG. 11d, the fin 20 includes a first semiconductor layer 231, and the isolation section 70 is doped with inert atoms.

In other words, the isolation section 70 is obtained by doping the first semiconductor layer 231 with inert atoms.

Certainly, the doping herein is merely doping, as required, a part used as the isolation section 70, and a part used as the channel 53 is not doped.

The inert atoms may include, for example, at least one type of hydrogen atoms, oxygen atoms, nitrogen atoms, carbon atoms, or silicon atoms.

In some embodiments, the fin 20 includes a first semiconductor layer 231, and a thickness t of the first semiconductor layer 231 in the isolation section 70 is less than a thickness t of the channel 53 of each of the two adjacent transistors 100.

In other words, in a direction perpendicular to spacing between the source 51 and the drain 52 of the transistor 10, the thickness t of the isolation section 70 in the first semiconductor layer 231 is less than the thickness t of the channel 53 of each of the two transistors 100.

A shape of the isolation section 70 may be, for example, rectangular. The thickness t of each part of the isolation section 70 is less than the thickness t of the channel 53 of each of the two transistors 100.

Alternatively, a shape of the isolation section 70 may be, for example, a dumbbell shape. The thickness t of the middle part of the isolation section 70 is less than the thickness t of the channel 53 of each of the two transistors 100.

A shape of the isolation section 70 may alternatively include a broken part. The thickness t (the thickness is 0) of the broken part of the isolation section 70 is less than the thickness t of the channel 53 of each of the two transistors 100.

Certainly, the shape of the isolation section 70 may be another shape, provided that the current transfer between the two channels 53 of the two transistors 100 can be suppressed.

In some embodiments, as shown in FIG. 19a to FIG. 19d, the fin 20 includes the first semiconductor layer 231 and an auxiliary layer that are alternately disposed. The auxiliary layer includes a gate material layer 2351 and a gate dielectric material layer 2352 that is wrapped outside the gate material layer 2351. The isolation section 70 and the channels 53 are formed at the first semiconductor layer 231.

Herein, a part that is of the first semiconductor layer 231 and that is used for the isolation section 70 is doped with inert atoms, and a part that is of the first semiconductor layer 231 and that is used for the channel 53 is not doped with inert atoms. The first semiconductor layer 231 and the auxiliary layer 235 are alternately disposed. The auxiliary layer 235 serves only an assistance function, and does not actually play a role of the isolation section 70 or the channel 53. Therefore, when the fin 20 includes a plurality of first semiconductor layers 231 and a plurality of auxiliary layers 235, some segments of the plurality of first semiconductor layers 231 are used as the isolation section 70 or the channel 53.

A quantity of first semiconductor layers 231 and a quantity of auxiliary layers 235 are not limited. The two quantities may be properly set as required. In addition, whether a layer closest to the substrate 10 and a layer farthest away from the substrate 10 is the first semiconductor layer 231 or the auxiliary layer 235 is not limited herein.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An integrated circuit device, comprising a substrate and a fin protruding from the substrate, wherein the integrated circuit device further comprises two adjacent transistors, and the two adjacent transistors use two spaced segments on the fin as respective channels of the two adjacent transistors; and
   a part that is of the fin and that is located between the two spaced segments is processed to obtain an isolation section as a portion of a first semiconductor layer in the part that is of the fin, and the isolation section is used to suppress current transfer between the two channels of the two adjacent transistors,
   wherein the fin comprises an auxiliary layer, the auxiliary layer comprises a gate material layer and a gate dielectric material layer that is wrapped outside the gate material layer, and the isolation section and the channels alternate with the auxiliary layer in respective regions in the fin, and
   wherein the isolation section comprises a discontinuity in the first semiconductor layer within the part that is of the fin.

2. The integrated circuit device according to claim 1, wherein the fin comprises the first semiconductor layer that is alternately disposed with the auxiliary layer, and the isolation section and the channels are formed at the first semiconductor layer in the respective regions in the fin.

3. The integrated circuit device according to claim 1, wherein the fin comprises a plurality of first semiconductor layers alternating with a plurality of auxiliary layers, and wherein the channels of the two adjacent transistors and the isolation section are formed in the plurality of first semiconductor layers.

4. The integrated circuit device according to claim 1, further comprising gates at locations surrounding the fin, the locations corresponding to the channels and the isolation section in the fin.

5. The integrated circuit device according to claim 4, wherein each of the gates further comprises a gate dielectric material layer and a gate material layer, and wherein the gate dielectric material layer and the gate material layer in the gates are made of the same material as the gate dielectric material layer and the gate material layer in the auxiliary layer, respectively.

6. A preparation method of an integrated circuit device, comprising:
   forming, on the substrate, a fin protruding from a substrate;
   forming at least two first dummy gates and at least one second dummy gate, wherein the at least two first dummy gates and the at least one second dummy gate are arranged in a gate length direction, each second dummy gate is located between two adjacent first dummy gates, and the first dummy gates and the second dummy gate all are in contact with two opposite side surfaces and a top surface of the fin;
   forming an inter-layer insulating layer, wherein an upper surface of the inter-layer insulating layer is aligned with upper surfaces of the second dummy gate and the first dummy gates;
   removing at least the second dummy gate, and processing a part that is of the fin and that is exposed after the second dummy gate is removed, to form an isolation section as a portion of a first semiconductor layer in the part that is of the fin, and wherein the part of the fin processed to form the isolation section further suppresses current transfer in the part that is of the fin and that is exposed after the second dummy gate is removed, wherein the isolation section comprises discontinuity in the first semiconductor layer within the part that is of the fin; and
   forming an auxiliary layer that alternates with the isolation section and the channels in respective regions in the fin, wherein the auxiliary layer comprises a gate material layer and a gate dielectric material layer that is wrapped outside the gate material layer.

7. The preparation method of the integrated circuit device according to claim 6, wherein the fin is formed by one layer from the first semiconductor layer;
   the removing at least the second dummy gate, and processing a part that is of the fin and that is exposed after the second dummy gate is removed, to form an isolation section as the portion of the first semiconductor layer in the part this is of the fin further comprises:
   removing the second dummy gate, and processing the part that is of the fin and that is exposed after the second dummy gate is removed, to form the isolation section and further suppress the current transfer in the part that is of the fin and that is exposed after the second dummy gate is removed; and
   after the isolation section is formed, the preparation method of the integrated circuit device further comprises: removing the first dummy gates, and separately forming a gate dielectric layer and a gate at a location at which each of the second dummy gate and the first dummy gates is removed.

8. The preparation method of the integrated circuit device according to claim 6, wherein the fin comprises a plurality of first semiconductor layers and a plurality of second semiconductor layers, and the first semiconductor layers and the second semiconductor layers are alternately disposed in the thickness direction of the substrate;
   before the inter-layer insulating layer is formed, the preparation method of the integrated circuit device further comprises: forming side walls on two sides of each of the second dummy gate and the first dummy gates in the gate length direction;
   removing the fin that is not covered by the first dummy gates, the side walls on the two sides of each of the first dummy gates, the second dummy gate, and the side walls on the two sides of the second dummy gate; and
   processing a region that is of the second semiconductor layer of the reserved fin and that is covered by the side walls, to form inner walls, and using, as a sacrificial layer, a remaining region that is not covered by the side walls; and
   the removing at least the second dummy gate, and processing a part that is of the fin and that is exposed after the second dummy gate is removed, to form an isolation section and further suppress current transfer in the part that is of the fin and that is exposed after the second dummy gate is removed comprises:
   removing the first dummy gates, the second dummy gate, and the sacrificial layer, and processing the part that is of the fin and that is exposed after the second dummy gate is removed, to form the isolation section and further suppress the current transfer in the part that is of the fin and that is exposed after the second dummy gate is removed; and
   after the isolation section is formed, the preparation method of the integrated circuit device further comprises: forming a gate dielectric layer and a gate at a location at which each of the second dummy gate and the first dummy gates is removed; and forming, at a location of the sacrificial layer, the auxiliary layer.

9. The integrated circuit device according to claim 5, wherein the gate dielectric material layer comprises a high-k dielectric layer and the gate material layer comprises a metal layer.

10. The preparation method of the integrated circuit device according to claim 6, wherein the auxiliary layer is formed by using an atomic layer deposition (ALD) process.

* * * * *